(12) United States Patent
Tokiwa et al.

(10) Patent No.: US 8,947,933 B2
(45) Date of Patent: Feb. 3, 2015

(54) NONVOLATILE SEMICONDUCTOR MEMORY APPARATUS

(71) Applicant: Kabushiki Kaisha Toshiba, Minato-ku, Tokyo (JP)

(72) Inventors: Naoya Tokiwa, Fujisawa (JP); Yasushi Nagadomi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/913,024

(22) Filed: Jun. 7, 2013

(65) Prior Publication Data
US 2014/0098609 A1    Apr. 10, 2014

(30) Foreign Application Priority Data

Oct. 9, 2012  (JP) .................. 2012-224296

(51) Int. Cl.
*G11C 16/06* (2006.01)
*G11C 16/04* (2006.01)

(52) U.S. Cl.
CPC .................. *G11C 16/0483* (2013.01)
USPC ................. 365/185.11; 365/185.29; 365/218; 365/185.05; 365/185.17; 365/185.24

(58) Field of Classification Search
CPC ........ G11C 16/04; G11C 16/06; G11C 16/10; G11C 16/14; G11C 7/00
USPC .................. 365/185.29, 185.11, 218, 185.05, 365/185.09, 185.17, 185.24, 189.011
See application file for complete search history.

(56) References Cited

U.S. PATENT DOCUMENTS

| 5,748,545 | A | 5/1998 | Lee et al. |
| 2006/0118784 | A1 | 6/2006 | Lee et al. |
| 2009/0268523 | A1 | 10/2009 | Maejima |
| 2010/0296342 | A1 | 11/2010 | Takizawa et al. |
| 2011/0228612 | A1 | 9/2011 | Hama |
| 2013/0016577 | A1* | 1/2013 | Nagadomi ................ 365/218 |

* cited by examiner

*Primary Examiner* — Thong Q Le
(74) *Attorney, Agent, or Firm* — Holtz, Holtz, Goodman & Chick PC

(57) ABSTRACT

According to one embodiment, a nonvolatile semiconductor memory apparatus includes a memory cell array, a row decoder, a controller. The memory cell array includes a plurality of memory strings. The memory strings include a first select transistor and a second select transistor, and are connected to each of a plurality of bit lines. The row decoder applies a voltage to the first and second select transistors. The controller detects a defect of the bit lines based on data read from the memory cells.

16 Claims, 15 Drawing Sheets

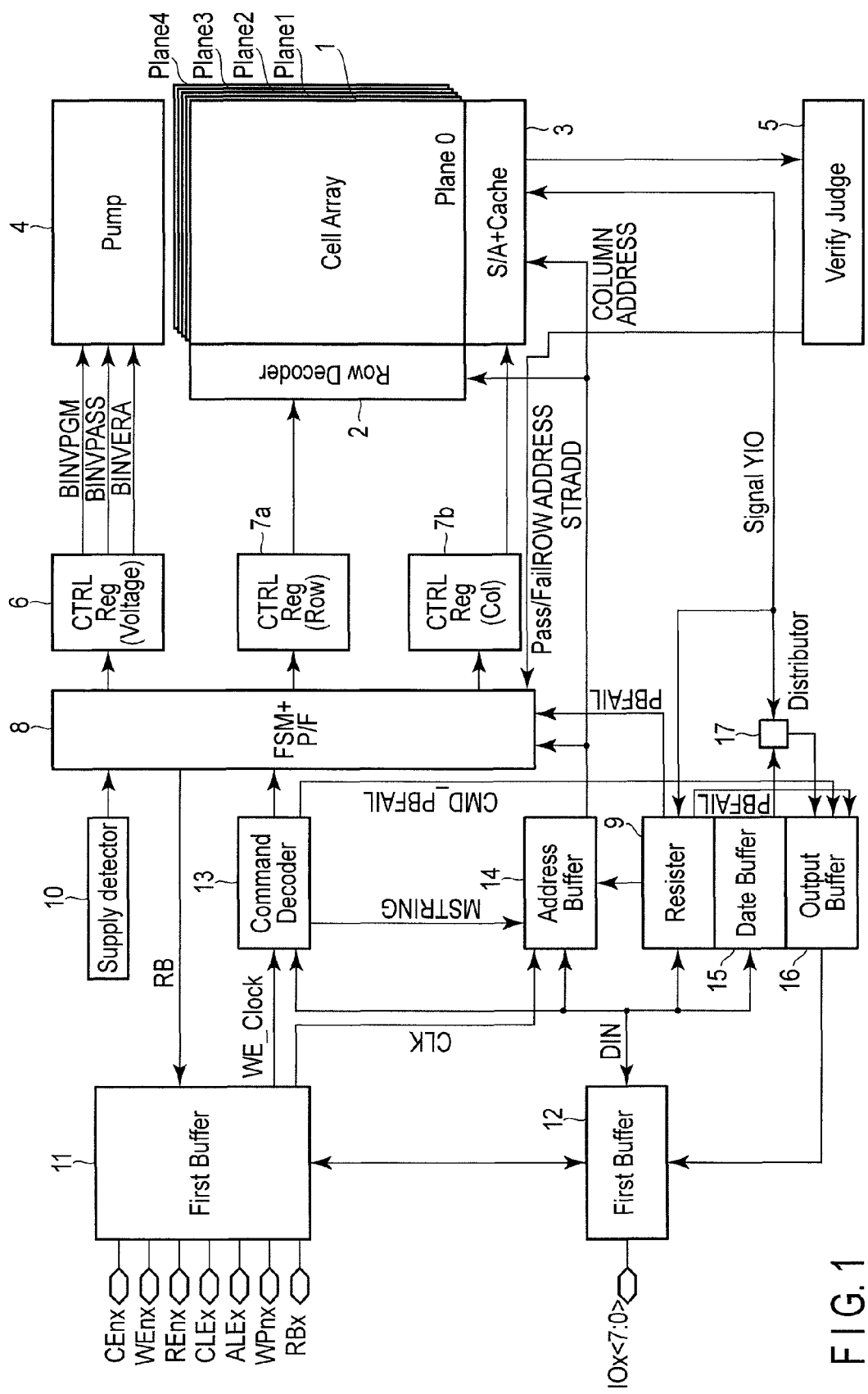
F I G. 1

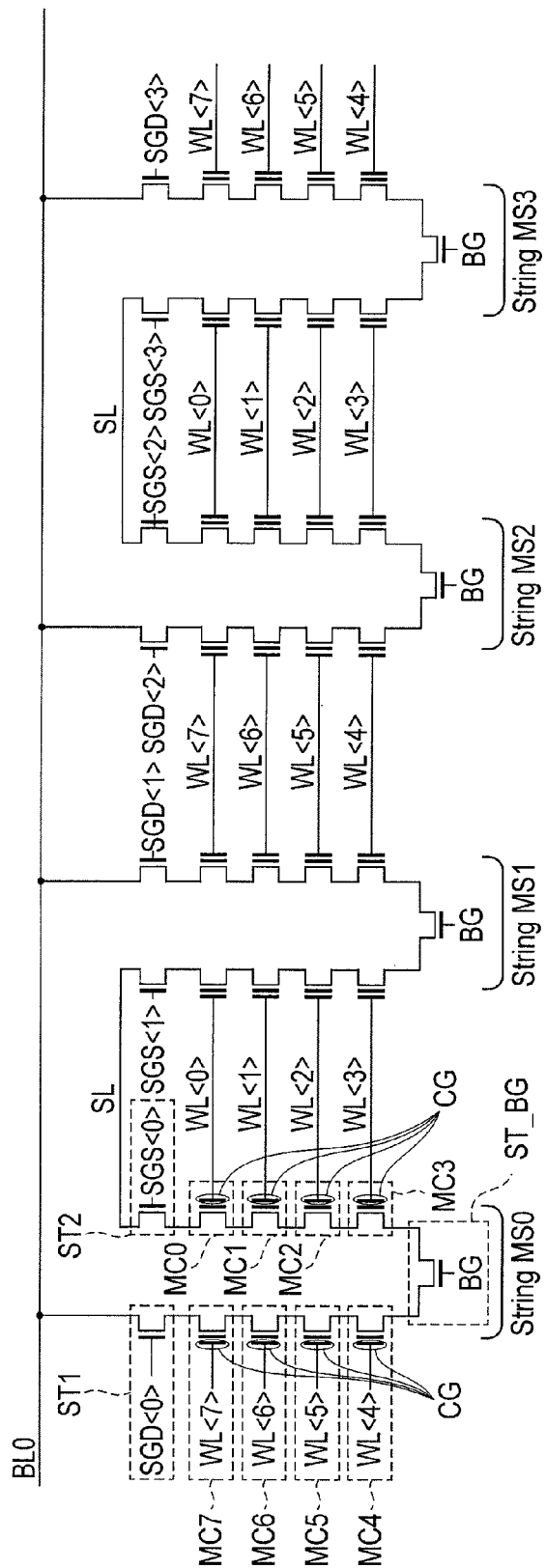
F I G. 4

| | STRADD | MS0 | MS1 | MS2 | MS3 | MS4 | MS5 | MS6 | MS7 | MS8 | MS9 | MS10 | MS11 |
|---|---|---|---|---|---|---|---|---|---|---|---|---|---|
| String0 selection | 001h | ○ | | | | | | | | | | | |
| String1 selection | 002h | | ○ | | | | | | | | | | |
| String2 selection | 004h | | | ○ | | | | | | | | | |
| String3 selection | 008h | | | | ○ | | | | | | | | |
| String4 selection | 010h | | | | | ○ | | | | | | | |
| String5 selection | 020h | | | | | | ○ | | | | | | |
| String6 selection | 040h | | | | | | | ○ | | | | | |
| String7 selection | 080h | | | | | | | | ○ | | | | |
| String8 selection | 100h | | | | | | | | | ○ | | | |
| String9 selection | 200h | | | | | | | | | | ○ | | |
| String10 selection | 400h | | | | | | | | | | | ○ | |
| String11 selection | 800h | | | | | | | | | | | | ○ |
| 2strings selection1 | 003h | ○ | ○ | | | | | | | | | | |
| 2strings selection2 | 00Ch | | | ○ | ○ | | | | | | | | |
| 2strings selection3 | 030h | | | | | ○ | ○ | | | | | | |
| 2strings selection4 | 0C0h | | | | | | | ○ | ○ | | | | |
| 2strings selection5 | 300h | | | | | | | | | ○ | ○ | | |
| 2strings selection6 | C00h | | | | | | | | | | | ○ | ○ |

Single selection: String0–String11 selection
Multiple selections: 2strings selection1–6

FIG. 8

| IO7 | IO6 | IO5 | IO4 | IO3 | IO2 | IO1 | IO0 |
|---|---|---|---|---|---|---|---|
| N/A | N/A | N/A | N/A | 1 | 1 | 1 | 1 |
| IO7 | IO6 | IO5 | IO4 | IO3 | IO2 | IO1 | IO0 |
|---|---|---|---|---|---|---|---|
| N/A | N/A | N/A | N/A | 0 | 0 | 1 | 0 |
F I G. 11
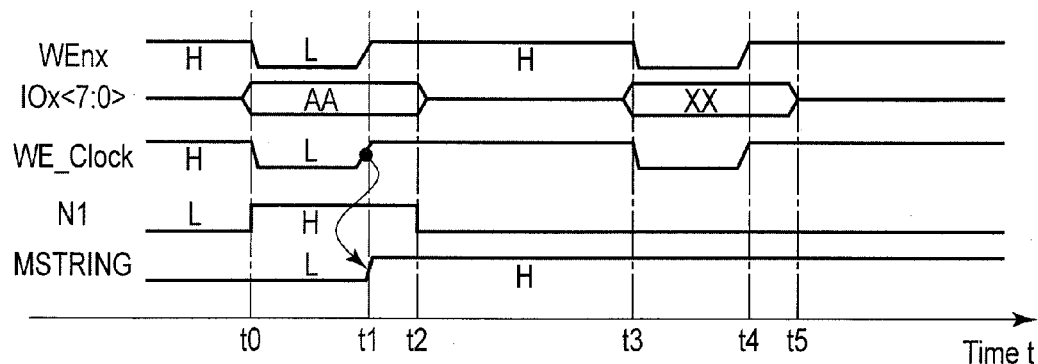
F I G. 12A
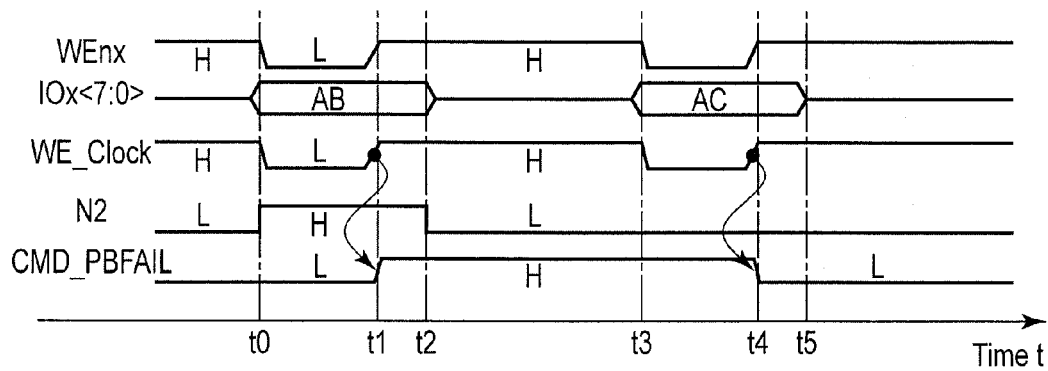
F I G. 12B

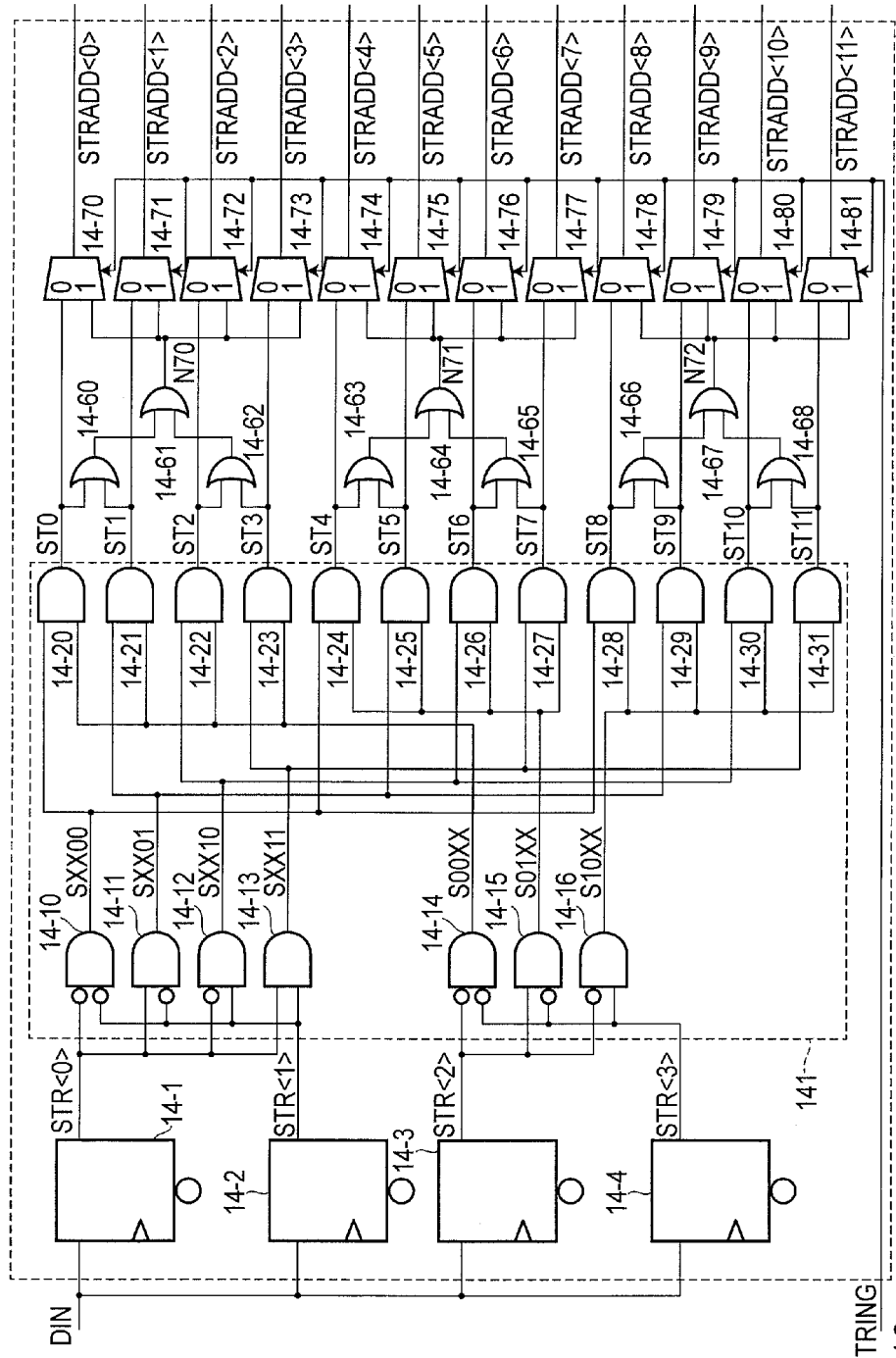
F I G. 16

| | STRADD | MS0 | MS1 | MS2 | MS3 | MS4 | MS5 | MS6 | MS7 | MS8 | MS9 | MS10 | MS11 |
|---|---|---|---|---|---|---|---|---|---|---|---|---|---|
| 4String selection 1 | 00Fh | ○ | ○ | ○ | ○ | | | | | | | | |
| 4String selection 2 | 0F0h | | | | | ○ | ○ | ○ | ○ | | | | |
| 4String selection 3 | F00h | | | | | | | | | ○ | ○ | ○ | ○ |
| 12strings selection | FFFh | ○ | ○ | ○ | ○ | ○ | ○ | ○ | ○ | ○ | ○ | ○ | ○ |

F I G. 17

NONVOLATILE SEMICONDUCTOR MEMORY APPARATUS

CROSS-REFERENCE TO RELATED APPLICATIONS

This application is based upon and claims the benefit of priority from Japanese Patent Application No. 2012-224296, filed Oct. 9, 2012, the entire contents of which are incorporated herein by reference.

FIELD

Embodiments described herein relate generally to a nonvolatile semiconductor memory apparatus capable of selecting a plurality of memory strings.

BACKGROUND

In recent years, a stacked semiconductor memory (BiCS: Bit Cost Scalable Flash Memory) in which memory cells are stacked has been developed. The BiCS may realize a large-capacity semiconductor memory at low cost.

BRIEF DESCRIPTION OF THE DRAWINGS

FIG. 1 shows an overall configuration example of a nonvolatile semiconductor memory apparatus according to a first embodiment;

FIG. 4 is an equivalent circuit of the memory cell array according to the first embodiment;

FIG. 8 is a conceptual diagram showing selected states of memory strings according to the first embodiment and a relationship diagram showing memory strings selected in accordance with a signal STRADD;

FIG. 11 is a conceptual diagram showing an output of defective information of planes from an IO pad according to the first embodiment;

FIG. 12A is a timing chart showing an operation of the command decoder according to the first embodiment and output timing of a signal MSTRING;

FIG. 12B is a timing chart showing the operation of the command decoder according to the first embodiment and output timing of a signal CMD_PBFAIL;

FIG. 16 is a block diagram showing details of an address buffer according to a second embodiment; and FIG. 17 is a conceptual diagram showing the selected state of memory strings according to the second embodiment and a relationship diagram showing memory strings selected in accordance with signal STRADD.

DETAILED DESCRIPTION

Figure 2:
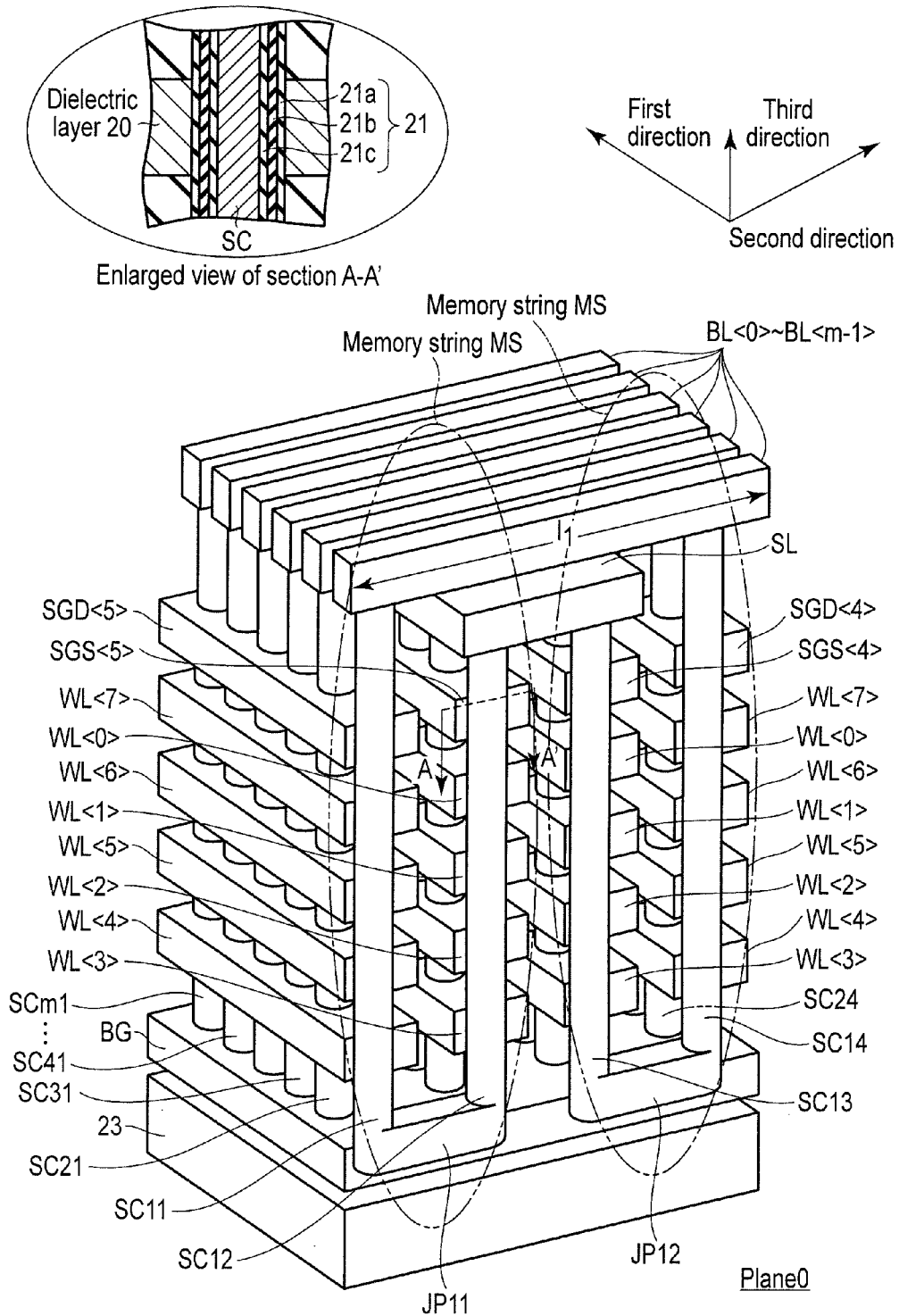
FIG. 2 shows a perspective view of a memory cell array according to the first embodiment and a sectional view of a memory cell.

Hereinafter, embodiments will be described with reference to the drawings. In the description, common reference numerals are assigned to common configurations throughout the drawings. However, note that the drawings are schematized the relationship between the thickness and plane dimensions, the ratio of the thickness of each layer and the like are different from the actual relationship, ratio and the like. Therefore, the concrete thickness and dimensions should be determined by considering the description that follows. Also, needless to say, the relationship and ratio of mutual dimensions may include differences between drawings.

It will be understood that when an element is referred to as being "electrically connected to" or "connected to" another element, it can be not only directly connected but also connected to the other element or intervening elements may be present.

The embodiments described below detect an open defect (so-called disconnection) of a bit line BL that arises during manufacturing process efficiently and in detail.

More specifically, a bit line BL open defect is detected efficiently and in detail by selecting a plurality of memory strings MS and detecting whether a current flows to the selected memory cells MS.

In general, according to one embodiment, a nonvolatile semiconductor memory apparatus includes a memory cell array, a row decoder, an address buffer, and a controller. The memory cell array includes a plurality of memory strings. Each of memory strings includes a plurality of memory cells stacked on a semiconductor substrate. The memory strings includes a first select transistor and a second select transistor provided on both sides so as to sandwich the memory cells therebetween. The memory strings are connected to each of a plurality of bit lines. The row decoder applies a voltage to the first and second select transistors corresponding to the memory string and capable of collectively selecting the memory strings. The address buffer controls the row decoder so that the memory strings are selected. The controller detects a defect of the bit lines based on data read from the memory cells provided in the selected memory string.

[First Embodiment]
[Overall Configuration Example]

An overall configuration of a nonvolatile semiconductor memory apparatus according to the first embodiment will be described with reference to FIG. 1. FIG. 1 is a block diagram of a nonvolatile semiconductor memory apparatus according to the first embodiment. The nonvolatile semiconductor memory apparatus is controlled by a memory controller (controller) (not shown). This configuration will be called a semiconductor apparatus. The semiconductor apparatus is configured by a set of the nonvolatile semiconductor memory apparatus and the memory controller. As an example of the semiconductor apparatus, an SD (trademark) card and SSD may be cited.

Also, the semiconductor apparatus is enabled to connect to an external host device (not shown) and a memory system is configured by the semiconductor apparatus and the host device. The semiconductor apparatus operates according to the control of the host device.

As shown in FIG. 1, a nonvolatile semiconductor memory apparatus according to the first embodiment includes a memory cell array 1 (Cell Array in FIG. 1), a row decoder 2 (Row Decoder in FIG. 1), a sense amplifier 3 (S/A+Cache in FIG. 1 including a cache), a pump circuit 4 (Pump in FIG. 1), a verify judge 5 (Verify Judge in FIG. 1), a voltage controller 6 (CTRL Reg(Voltage) in FIG. 1), a row control register 7a (CTRL Reg(Row) in FIG. 1), a column control register 7b (CTRL Reg(Col) in FIG. 1), a state machine 8 (FSM+ P/F in FIG. 1), a register 9 (Register in FIG. 1), a supply detector 10, first buffers 11, 12 (First Buffer in FIG. 1), a command decoder 13 (Command Decoder in FIG. 1), an address buffer 14 (Address Buffer in FIG. 1), a data buffer 15 (Data Buffer in FIG. 1), an output buffer 16 (Output Buffer in FIG. 1), and a distributor 17. Each element of the nonvolatile semiconductor memory apparatus will be described below.

<Memory Cell Array 1>

The memory cell array 1 includes, for example, planes P0 to P4 (Plane 0, Plane 1, Plane 2, Plane 3, and Plane 4 in FIG. 1) capable of holding data. For example, among planes P0 to P4, a management data storage area (not shown) is formed on one of the planes.

Each of planes P0 to P4 includes a plurality of memory cells MC arranged three-dimensionally. Also, planes P0 to P4 are provided with a plurality of bit lines BL, word lines WL, and source lines SL electrically connected to the memory cells MC. The structure of a plane P will be described later.

The management data storage area is an area to hold control information such as parity information. In the present embodiment, the management data storage area is an area capable of holding, in addition to the control information, open defective information of the bit line BL described later and defective information of the plane P.

The management data storage area also functions as an area to save defective information held by the register 9 described later. This is because the register 9 is formed of a volatile storage area and may not hold defective information after being turned off.

A case when the memory cell array 1 includes planes P0 to P4 is cited, but the number of the planes P to be held is not limited. In the description that follows, only two planes of plane P0 and plane P1 may be used or a different number of planes may be used. When planes P0 to P4 are not distinguished, the plane is simply denoted as the plane P.

A detailed configuration of the plane P capable of holding data will be described below by using FIG. 2.

<Detailed Structure of the Plane P>

FIG. 2 is a perspective view showing, as an example, a part of the structure of plane P0 three-dimensionally. The structure of planes P1 to P4 is the same as that of plane P0 and thus, the description thereof is omitted.

First, a semiconductor layer SC will be described. As shown in FIG. 2, the semiconductor layers SC in a columnar shape are formed in a matrix shape (6×4) on a plane formed by a first direction and a second direction. A plurality of the semiconductor layers SC is formed on a semiconductor layer BG formed via a semiconductor substrate 23 along a third direction, which is perpendicular to the first direction and the second direction.

The semiconductor layers SC adjacent to each other along the second direction are joined in the semiconductor layer BG via a joining portion JP. In this manner, a memory string MS in a U shape is formed by the semiconductor layers SC adjacent to each other via the joining portion JP. The memory string MS includes a select transistor ST1 and a select transistor ST2 described later.

Therefore, when, as shown in FIG. 2, semiconductor layers SC11, SC12, SC13, and SC14 are successively formed in the second direction from the near side, semiconductor layers SC11, SC12 are joined by a joining portion JP11 and semiconductor layers SC13, SC14 are joined by a joining portion JP12.

Sets of the other semiconductor layers SC including, for example, a set of semiconductor layers SC21, SC22 and a set of semiconductor layers SC23, SC24 formed next to these semiconductor layers SC11, SC12, SC13, SC14 along the first direction are configured in the same manner and thus, the description thereof is omitted.

The length of the bit line BL in the second direction where semiconductor layers SC11, SC12 and semiconductor layers SC13, SC14 are provided is set as $l_1$.

Next, a plurality of word lines WL is formed by extending in the first direction on a plane formed by the first direction and the second direction where the semiconductor layers SC are formed. These word lines WL are also formed in a plurality of layers in the third direction. Accordingly, the memory cell MC is formed in an area corresponding to an intersection of the word line WL and the semiconductor layer SC.

In the present embodiment, as an example, the number of the word lines WL provided in the third direction is set to four (in FIG. 2, word lines WL<0> to WL<3> are provided along semiconductor layer SC11 and word lines WL<4> to WL<7> are provided along semiconductor layer SC12). That is, word line WL<0>, word line WL<1>, ... , and word line WL<7> are connected to a control gate CG of a memory cell MC0, a memory cell MC1, ... , and a memory cell MC7, respectively. Then, as is evident from the fact that the number of the word lines WL is four, eight memory cells MC are formed in one memory string MS in the present embodiment.

Next, the sectional structure of the memory cell MC will be described. An enlarged view of the memory cell MC along a section direction of A-A' is shown at the upper left of FIG. 2.

As illustrated, a gate oxide film 21c, a charge accumulation layer 21b, and a block layer 21a formed of a material (that may be called high-k) having a dielectric constant higher than that of the gate oxide film 21c are successively formed from the surface of the semiconductor layer SC as if to cover the surface of the semiconductor layer SC. Further, a dielectric layer 20 is formed as if to cover the surface of the block layer 21a. The dielectric layer 20 functions as the control gate CG and the control gate CG is connected to the word line WL.

Further, a detailed description of plane P0 will continue.

A select signal line SGD<5> on the drain side provided further above the word line WL formed in the top layer is set as the base point, word lines WL<7>, WL<6>, WL<5>, and WL<4> are successively formed along semiconductor layer SC11 toward lower layers.

Furthermore via the joining portion JP11, word lines WL<3>, WL<2>, WL<1>, and WL<0> and a select signal line SGS<5> are successively formed along semiconductor layer SC12 from lower layers toward upper layers.

As just described, the memory string MS is formed in a U shape.

Similarly, a select signal line SGD<4> on the drain side provided further above the word line WL formed in the top layer is set as the base point, word lines WL<7>, WL<6>, WL<5>, and WL<4> are successively formed along semiconductor layer SC14 as lower layers.

Furthermore via the joining portion JP12, word lines WL<3>, WL<2>, WL<1>, and WL<0> and a select signal line SGS<4> are successively formed along semiconductor layer SC13 from lower layers toward upper layers.

The stacked word lines WL are formed separately between semiconductor layers SC11, SC12, between semiconductor layers SC13, SC14, and between semiconductor layers SC12, SC13 arranged next to each other, but the word lines WL may commonly be connected between semiconductor layers SC12, SC13.

Each of one ends of semiconductor layers SC12, SC13 passing through select signal lines SGS<4>, SGS<5>, respectively, is connected to the source line SL. That is, semiconductor layers SC11, SC12 and semiconductor layers SC13, SC14 adjacent to each other are commonly connected by the source line SL.

Further, each of one ends of semiconductor layers SC11, SC14 passing through select signal lines SGD<4>, SGD<5>, respectively, is commonly connected to bit line BL<0>. Similarly, each of one ends of semiconductor layers SC21, SC24 passing through select signal lines SGD<4>, SGD<5>, respectively, is commonly connected to bit line BL<1> and also each of one ends of semiconductor layers SC31, SC34 is commonly connected to bit line BL<2> and also similarly below, one end of semiconductor layer SCm1 and one end of semiconductor layer SCm4 are commonly connected to bit line BL<m−1>.

The structure of the memory string MS formed from semiconductor layers SC13, SC14 is the same as that of the memory string MS formed from semiconductor layers SC11, SC12 and thus, the description thereof is omitted.

A case when each memory string MS is configured by memory cells MC0 to MC7 and select transistors ST1 and ST2 was explained, but the number of the memory cells MC is not limited. In other words, the number of the memory cells MC may be 16 or 32. When necessary, the number of the memory cells MC may be set to s (s: natural number) below.

Thus, plane P0 is configured by arranging the memory cells MC storing data electrically in a three-dimensional matrix shape. That is, the memory cell MC is arranged in a matrix shape not only in the laminating direction, but also in the horizontal direction perpendicular to the laminating direction. Thus, a plurality of the memory cells MC arranged in the laminating direction is connected in series and the plurality of the memory cells MC arranged in the laminating direction constitutes the memory string MS.

As will be described later, an aggregate of the memory strings MS (for example, 12 memory strings MS) constitutes a block BLK. The plane P refers to an aggregate formed from a plurality of the blocks BLK and a plurality of the planes P may perform a read, write, or erase operation at the same time.

The subject will return to the memory string MS. In the memory string MS, the drain-side select transistor SGD (select transistor ST1) is provided next to memory cell MC7 and the source-side select transistor SGS (select transistor ST2) is provided next to memory cell MC0.

When select transistor ST1 and select transistor ST2 are selected, the memory string MS corresponding thereto is put into a conducting state.

The memory string MS is arranged in the laminating direction as a longitudinal direction. One end of select transistor ST1 is connected to the bit line BL. One end of select transistor ST2 is connected to the string line SL.

<Definition of the Block BLK>

Figure 3:
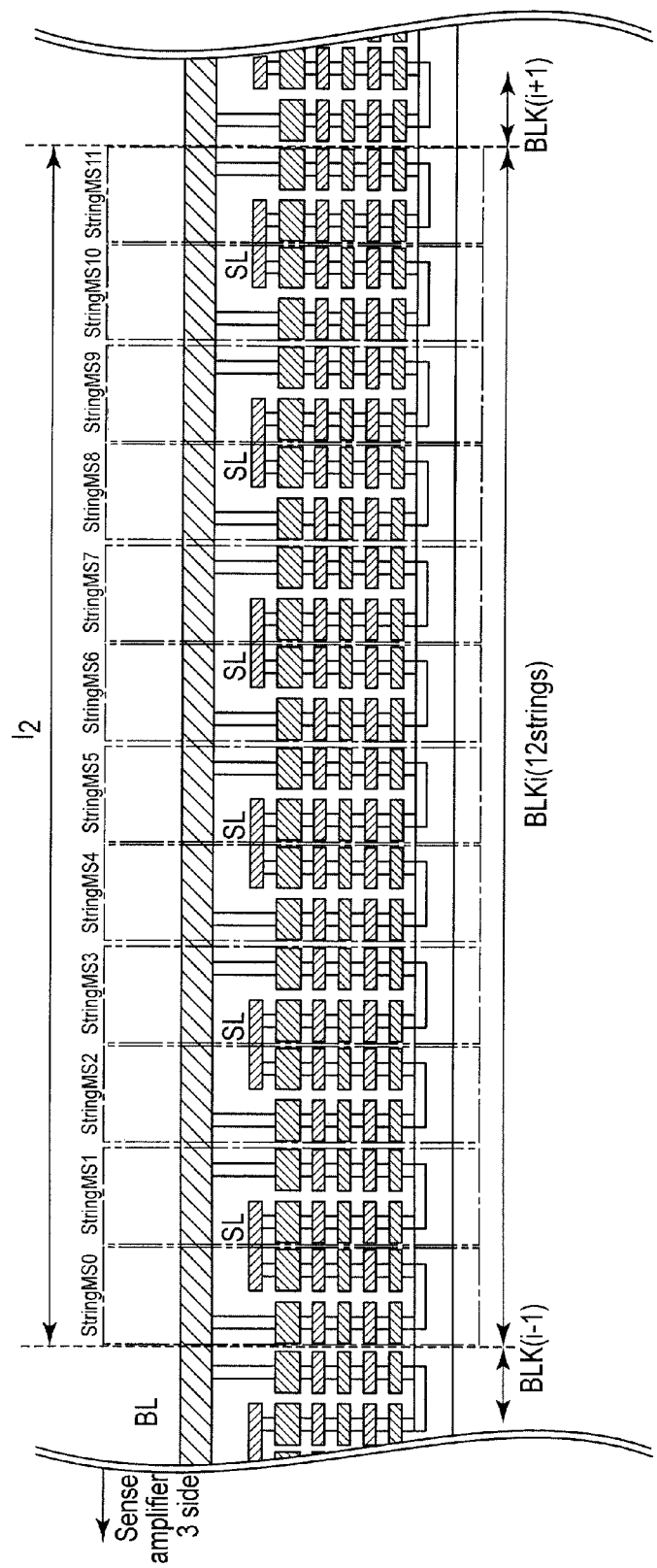
FIG. 3 is a sectional view of the memory cell array according to the first embodiment.

The definition of the block BLK will be described by using FIG. 3. FIG. 3 is a sectional view of the memory cell array 1 and here a sectional view of the memory string MS connected to bit line BL<0>, but in the actual configuration, bit lines BL<1> to BL<m−1> are formed in the depth direction of the paper sheet.

As illustrated, for example, a plurality of the memory strings MS is electrically connected to the same bit line BL<0>. In the present embodiment, 12 memory strings MS are connected to one bit line BL and the unit of m bit lines BL is called the block BLK. In this case, m×12 memory strings MS are formed per block BLK. As shown in FIG. 3, the length of the bit line BL corresponding to the unit configured by, for example, memory strings MS0 to MS11 is set as $l_2(>l_1)$.

The length of $l_2$ is about 6 to 10 times the length of $l_1$. Hereinafter, an open defect of the bit line BL described later is detected in units of the block BLK.

It is assumed that blocks BLK0 to BLKi are provided in bit line BL<0> and this also applies to the other bit lines BL<1> to BL<m−1>.

<Row Decoder 2>

The configuration of the nonvolatile semiconductor memory apparatus will be described by returning to FIG. 1 again. The row decoder 2 selects the word line WL passing through the memory cell array 1 according to the row address and string address (ROW ADDRESS and STRADD in FIG. 1) transferred from the address buffer 14 and the row control register 7a.

Next, the row decoder 2 transfers the desired voltage to the selected word line WL. The voltage transferred to the word line WL is supplied from the pump circuit 4.

<Sense Amplifier 3>

The sense amplifier 3 selects the bit line BL according to the column address (COLUMN ADDRESS in FIG. 1) transferred from the address buffer 14 and the column control register 7b and reads data held by the memory cell MC connected to the selected bit line BL. The sense amplifier 3 also writes data to the memory cell MC connected to the selected bit line BL.

When reading or writing data, the sense amplifier 3 transfers the desired voltage (for example, the internal voltage VDD(=1.8 V), VSS(=0 V) and so on) to the selected bit line BL. The voltage VDD transferred to the bit line BL is supplied from the pump circuit 4.

The sense amplifier 3 also inputs/outputs write data and read data to/from a memory controller (not shown) via signal line YIO. That is, signal line YIO is a bidirectional bus.

Further, the sense amplifier 3 includes, for example, three cache circuits (for example, first, second, and third cache circuits). These cache circuits have a function to temporarily hold write data or read data, but in addition to this function, these cache circuits in the present embodiment hold open defective information of an area (first area) of the bit line BL on the near side (block BLK(i−1) side in FIG. 3) when viewed from the sense amplifier 3, open defective information of the bit line BL (second area) in the center portion (for example, near block BLKi in FIG. 3) when viewed from the sense amplifier 3, and open defective information of the bit line BL (third area) on the farthest side (for example, on block BLK (i+1) side in FIG. 3) when viewed from the sense amplifier 3. The function of the cache circuit to hold defective information of the bit line BL will be described later.

The sense amplifier 3 temporarily holds read data in these cache circuits and performs an operation of the data to transfer the operation result to the verify judge 5. This also applies to a verify operation after data being written.

The sense amplifier 3 and each of the cache circuits are connected to the corresponding bit line BL, which is known and thus, the description thereof is omitted.

<Pump Circuit 4>

The pump circuit 4 receives a signal BINVPGM, a signal BINVPASS, and a signal BINVERA from the voltage controller 6 to generate a voltage VPGM, a voltage VPASS, a voltage VCGR, a voltage VREAD, and a voltage VERA based on the voltage supplied from outside. Next, these voltages generated by the pump circuit 4 are supplied to the row decoder 2.

The voltage VPGM is a voltage of a magnitude to the extent that the transition of the threshold to another level is caused after charges of a channel formed immediately below the memory cell MC being injected into a change trap layer. The voltage VPASS is a voltage to turn on regardless of data held by the memory cell MC.

The voltage VCGR is a voltage value in accordance with data held by the memory cell MC. The voltage VREAD is a voltage to turn on regardless of data held by the memory cell MC. The voltage VERA is a voltage supplied to the semiconductor layer SC to erase data held by the memory cell MC.

In addition to the above voltages, the pump circuit 4 generates, for example, the above internal voltage VDD (for example, 1.8 V) based on the voltage supplied from outside. The internal voltage VDD is supplied to the sense amplifier 3 when data is read or written.

<Verify Judge 5>

The verify judge 5 judges whether read data supplied from the sense amplifier 3 is correct and transfers the judgment result (Pass or Fail in FIG. 1) to the state machine 8. The read data supplied from the sense amplifier 3 refers to data obtained by read verify, write verify, or erase verify.

<Voltage Controller 6>

The voltage controller 6 supplies a signal BINVPGM and the voltages BINVPASS and BINVERA to the pump circuit 4 according to the control by the state machine 8.

<Row Control Register 7a>

The row control register 7a specifies, for example, the selected block BLK according to the control of the state machine 8.

<Column Control Register 7b>

The column control register 7b controls the sense amplifier 3 according to the control of the state machine 8. More specifically, the column control register 7b controls the timing and the like when read data is transferred to the cache.

<State Machine 8>

The state machine 8 controls the operation of the whole nonvolatile semiconductor memory apparatus. More specifically, based on the decode result of a control signal supplied from the command decoder 13, the state machine 8 executes an operation sequence for a write operation, read operation, or erase operation of data.

To execute the sequence, the state machine 8 controls the operation of each circuit block included in the nonvolatile semiconductor memory apparatus. For example, the state machine 8 controls the voltage controller 6 to generate a predetermined voltage and also controls the row control register 7a that controls the word line WL.

This applies also to the bit line BL. That is, the state machine 8 controls the column control register 7b that controls the bit line BL.

The state machine 8 also controls to prevent the corresponding sense amplifier 3 from operating based on information of block BLK defects, plane P defects, and open defects of the bit line BL. The state machine 8 also exercises control to ignore the corresponding sense amplifier 3.

Further, the state machine 8 manages information of block BLK defects, plane P defects, and open defects of the bit line BL and supplies the management information to the register 9.

More specifically, based on bit line BL open defective information and block BLK defective information, the state machine 8 causes the register 9 to hold management information (signal PBFAIL described later) such as which plane P is defective.

The state machine 8 also receives detection information from the supply detector 10 to perform a predetermined operation such as an initial operation. For example, the predetermined operation is initialization of data held by the register 9.

<Register 9>

The register 9 holds defective information (PBFAIL in FIG. 1) of the plane P and supplies the information to the state machine 8, the address buffer 14, and the output buffer 16. When holding defective information of the plane P, the register 9 takes a configuration capable of holding register information of one bit (value of 0 or 1) for each plane P.

<Supply Detection Circuit 10>

The supply detector 10 detects whether power is supplied from outside. Next, the supply detector 10 supplies the detection result to the state machine 8.

<First Buffer 11>

The first buffer 11 receives various kinds of control information from the memory controller. More specifically, the first buffer 11 receives control information such as a chip enable signal (CEnx in FIG. 1), a write enable signal (WEnx in FIG. 1), a read enable signal (REnx in FIG. 1), a command latch enable signal (CLEx in FIG. 1), an address latch enable signal (ALEx in FIG. 1), and a write protect signal (WPnx in FIG. 1). As an example, the write enable signal is used as a timing signal for command input. The first buffer 11 supplies the above received control signal to the command decoder 13.

The first buffer 11 outputs a ready/busy signal (RBx in FIG. 1) output from the state machine 8 and the like to the memory controller. The ready/busy signal is a signal indicating whether a nonvolatile semiconductor memory apparatus is ready to receive a command cmd, an address Add, data DATA and the like from the memory controller.

When the nonvolatile semiconductor memory apparatus may receive the command cmd, the address Add, and the data DATA, the ready/busy signal is made high and when the nonvolatile semiconductor memory apparatus maynot receive such information, the ready/busy signal is made low.

<First Buffer 12>

The first buffer 12 receives the command cmd, the address Add, and write data DATA from the memory controller (not shown) via an TO pad (IOx<7:0> in FIG. 1). The timing to receive the command cmd, the address Add, and the write data DATA is synchronized with the write enable signal supplied to the first buffer 11.

Next, the first buffer 12 supplies the command cmd received from the memory controller to the command decoder 13. The first buffer 12 also supplies the address Add received from the memory controller to the address buffer 14. Further, the first buffer 12 supplies the write data DATA received from the memory controller to the data buffer 15.

Also, the first buffer 12 supplies read data DATA supplied from the output buffer 16 or defective information of the plane P to the memory controller via the IO pad. The read data DATA or defective information of the plane P is read into the memory controller in synchronization with the read enable signal.

<Command Decoder 13>

The command decoder 13 receives control information (CEnx, WEnx, REnx, CLEx, ALEx, WPnx) and command cmd supplied from the first buffers 11, 12 and supplies the control information and a decode result of the command cmd to the state machine 8.

The command decoder 13 also supplies a signal CMD_PB-FAIL to the output buffer 16. Signal CMD_PBFAIL is a signal output when the memory controller requests defective information of the plane P.

Further, the command decoder 13 supplies signal MSTRING to the address buffer 14. Signal MSTRING is a signal to set whether to select a plurality of memory strings MS in one block BLK. More specifically, when signal MSTRING is made high, the plurality of memory strings MS in one block BLK is selected at the same time and when signal MSTRING is made low, one memory string MS in one block BLK is selected.

<Address Buffer 14>

The address buffer 14 generates signal STRADD based on the address Add supplied from the first buffer 12 and signal MSTRING from the command decoder 13. Next, the address buffer 14 supplies the address Add (column address) to the sense amplifier 3 and the state machine 8 and further, the address Add (row address) and signal STRADD to the row decoder 2 and the state machine 8.

<Data Buffer 15>

The data buffer 15 receives write data DATA from the first buffer 12 and supplies the write data DATA to the sense amplifier 3.

<Output Buffer 16>

The output buffer 16 outputs read data DATA supplied from the distributor 17 to the memory controller (not shown) via the first buffer 12. The output buffer 16 also outputs defective information of the plane P based on signal CMD_PBFAIL and signal PBFAIL supplied from the command decoder 13 and the register 9, respectively. More specifically, if signal CMD_PBFAIL is made high, defective information of the plane P, that is, signal PBFAIL is output.

<Distributor 17>

The distributor 17 distributes data DATA. In other words, for example, read data DATA from the sense amplifier 3 is output to the output buffer 16 via the distributor 17 and write data DATA transferred from the memory controller is output to the sense amplifier 3 via the distributor 17.

<Circuit Diagram of the Memory String MS>

Next, a circuit diagram of the above memory string MS will be described by using FIG. 4. Each of memory strings MS0 to MSk (k is a natural number greater than or equal to 1; here k=3) has the same structure and thus, the description below focuses on memory string MS0. The number of memory cells MC included in each of the memory strings MS is assumed to be eight (s=8).

<Memory String MS0>

The circuit configuration of memory string MS0 will be described. Memory string MS0 includes memory cells MC0 to MC7, select transistor ST1, select transistor ST2, and a transistor ST BC.

As described above, the control gate CG of memory cells MC0 to MC7 is connected to the word line WL. Next, memory cells MC0 to MC3 are connected in series between select transistor ST2 and the transistor ST_BG.

To describe a concrete connection relationship, the other end of the current path of select transistor ST2 is connected to the source line SL and a signal SGS<0> is supplied to the gate thereof. One end of the current path of select transistor ST_BG is connected to one end of the current path of memory cell MC3 and a signal BG is supplied to the gate thereof.

Memory cells MC4 to MC7 are connected in series between select transistor ST1 and the transistor ST_BG. The other end of the current path of select transistor ST1 is connected to bit line BL<0> and a signal SGD<0> is supplied to the gate thereof. The other end of the current path of select transistor ST_BG is connected to one end of the current path of memory cell MC4.

As described above, memory strings MS1 to MS3 are configured in the same manner as memory string MS0 and thus, the description thereof is omitted.

Each of the control gates CG of memory cells MC0 to MC7 provided in memory strings MS0 to MS3 is commonly connected as if to traverse through plane P0.

A concrete description will be provided by taking memory cell MC0 as an example. Each of the control gates CG is commonly connected to the control gates CG of all memory cells MC0 in memory strings MS0 to MS3 connected to the other bit lines BL<1> to BL<m−1> (not shown).

<Threshold Voltage Distribution of the Memory Cell MC>

Figure 5:
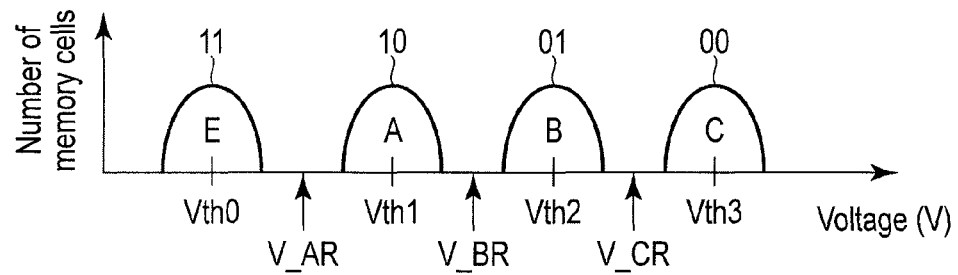
FIG. 5 is a graph showing a threshold voltage distribution of the memory cell according to the first embodiment.

The threshold voltage distribution of the memory cell MC will be described by using FIG. 5. FIG. 5 is a graph in which the threshold voltage is represented by the horizontal axis and the number of memory cells MC is represented by the vertical axis.

As illustrated, each of the memory cells MC may hold, for example, 4-valued (4-level) data (2-bit data). That is, the memory cell MC may hold four kinds of data of values 11, 10, 01, and 00 in ascending order of threshold voltage Vth. The holding data involved in the threshold voltage Vth is fluctuated by charges being injected into the charge accumulation layer.

A threshold voltage Vth0 of binary 11 data in the memory cell MC indicates an erase state (E in FIG. 5) and has a relationship Vth0<V_AR. In other words, the erase state of the memory cell MC in the present embodiment is positioned on the positive side. A threshold voltage Vth1 (A in FIG. 5) of binary 10 has a relationship V_AR<Vth1<V_BR. A threshold voltage Vth2 (B in FIG. 5) of binary 01 has a relationship V_BR<Vth2<V_CR. Further, a threshold voltage Vth3 (C in FIG. 5) of binary 00 has a relationship V_CR<Vth3. Thus, the memory cell MC is enabled to hold 2-bit data of values 11, 10, 01, and 00 in accordance with the threshold.

The memory cell MC may be enabled to hold 8- or more valued data.

<Details of the Command Decoder 13>

Figure 6:
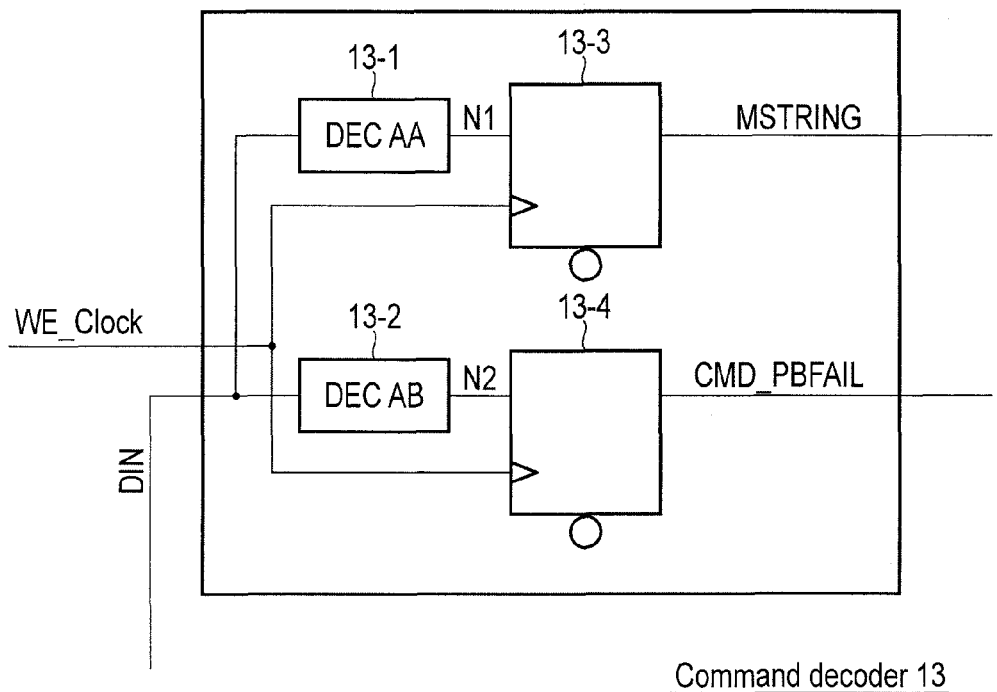
FIG. 6 is a block diagram showing details of a command decoder according to the first embodiment.

A detailed configuration of the command decoder 13 will be described by using FIG. 6. FIG. 6 is a block diagram showing details of the command decoder 13.

As shown in FIG. 6, the command decoder 13 includes a first decoder 13-1, a second decoder 13-2, a register 13-3, and a register 13-4.

The first decoder 13-1 receives a signal DIN (8-bit data) supplied from the first buffer 12 to decode signal DIN. The decode result (signal N1) is supplied to the register 13-3. The first decoder 13-1 is designed so that a high is output from the first decoder 13-1 when the value of signal DIN is, for example, AA(10101010).

The register 13-3 receives the decode result (signal N1) from the first decoder 13-1. The value of signal N1 is output as signal MSTRING in the timing when a signal WE_Clock supplied from the first buffer 11 goes high. Signal WE_Clock is a signal in phase with the write enable signal (WEnx) shown in FIG. 1.

If signal N1 is high on the rising edge of signal WE_Clock, the register 13-3 outputs signal MSTRING as high. It is desirable for the design to be such that once signal MSTRING is made high, even if other commands (other than AA) are input, signal MSTRING is kept high and goes low when a reset command (not shown) is input.

The second decoder 13-2 receives a signal DIN (8-bit data) supplied from the first buffer 12 to decode signal DIN. The decode result (signal N2) is supplied to the register 13-4. The second decoder 13-2 is designed so that the a high is output from the second decoder 13-2 when the value of signal DIN is, for example, AB(10101011).

The register 13-4 receives the decode result (signal N2) from the second decoder 13-2. Next, the value of signal N2 is output as signal CMD_PBFAIL in the timing when signal WE_Clock supplied from the first buffer 11 goes high. If signal N2 is high on the rising edge of signal WE_Clock, signal CMD_PBFAIL is made high.

A configuration in which signal CMD_PBFAIL is returned to low when a command (for example, AC[10101100]) that is different from the command AB(10101011) is input into the IO pad may be adopted to be able to switch to output of other defective information (for example, page write defective information).

The operation of the command decoder 13 will be described later.

<Details of Address Buffer 14>

Figure 7:
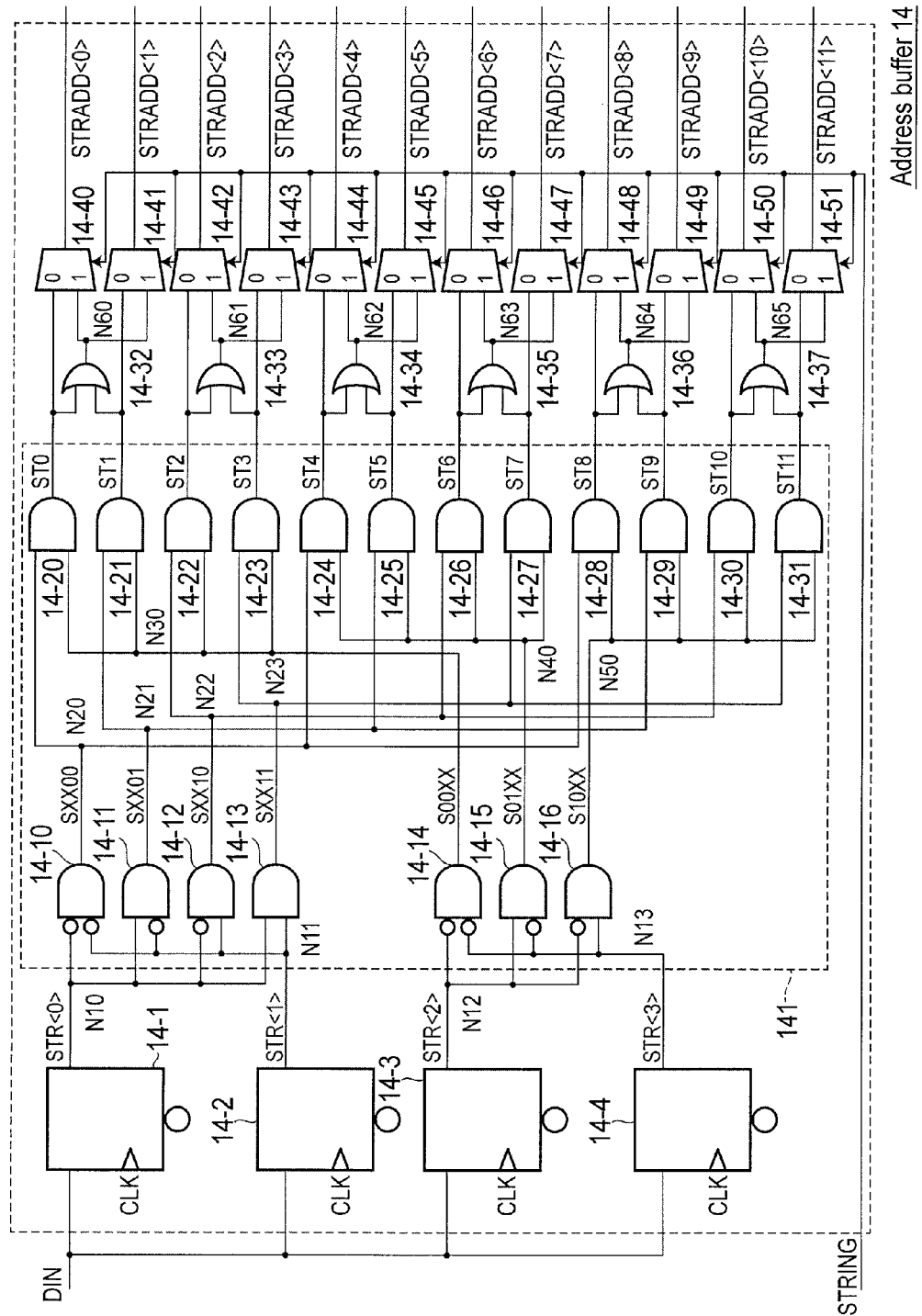
FIG. 7 is a block diagram showing details of an address buffer according to the first embodiment.

A detailed configuration of the address buffer 14 will be described by using FIG. 7. FIG. 7 is a circuit diagram showing a detailed configuration of the address buffer 14. As described above, when signal MSTRING (=high) is received from the command decoder 13, the address buffer 14 makes a plurality of signals STRADD high according to signal. In the present embodiment, the two signals STRADD are made high so that two memory strings MS adjacent to each other are put into a selected state. More specifically, one set of a set of a signal STRADD<0> and a signal STRADD<1>, . . . , and a set of signal STRADD<10> and a signal STRADD<11> is made high. The configuration for generating signal STRADD will be described below.

<Configuration>

As shown in FIG. 7, the address buffer 14 includes registers 14-1 to 14-4, circuits 14-10 to 14-16, AND gates 14-20 to 14-31, OR gates 14-32 to 14-37, and select circuits 14-40 to 14-51. Circuits 14-10 to 14-16 and AND gates 14-20 to 14-31 constitute a decoder unit 141.

<Configuration of the Registers 14-1 to 14-4>

The register 14-1 receives signal DIN and outputs information of signal DIN to a node N10 in the timing when the clock CLK is made high.

The register 14-2 receives signal DIN and outputs information of signal DIN to a node N11 in the timing when the clock CLK is made high.

The register 14-3 receives signal DIN and outputs information of signal DIN to a node N12 in the timing when the clock CLK is made high.

The register 14-4 receives signal DIN and outputs information of signal DIN to a node N13 in the timing when the clock CLK is made high.

<Configuration of the Decoder Unit 141>
<Configuration of Circuits 14-10 to 14-16>

Each of circuits 14-10 to 14-13 performs an operation of the voltage level of node N10 and the voltage level of node N11.

More specifically, circuit 14-10 performs an AND operation of values obtained by inverting the voltage levels of node N10 and node N11 and outputs the operation result to a node N20 as a signal SXX00.

Circuit 14-11 performs an AND operation of the value obtained by inverting the voltage level of node N11 and the value of node N10 and outputs the operation result to a node N21 as a signal SXX01. Circuit 14-12 performs an AND operation of the value obtained by inverting the voltage level of node N10 and the value of node N11 and outputs the operation result to a node N22 as a signal SXX10. Further, circuit 14-13 performs an AND operation of the voltage levels of node N10 and node N11 and outputs the operation result to a node N23 as a signal SXX11.

Circuit 14-14 performs an AND operation of values obtained by inverting the voltage level of node N12 and the voltage level of node N13. Next, circuit 14-14 outputs the operation result to a node N30 as a signal S00XX.

Circuit 14-15 performs an AND operation of the voltage level of node N12 and the value obtained by inverting the voltage level of node N13 and outputs the operation result to a node N40 as a signal S01XX.

Further, circuit 14-16 performs an AND operation of the value obtained by inverting the voltage level of node N12 and the voltage level of node N13 and outputs the operation result to a node N50 as a signal S10XX.

Next, the configuration of AND gates 14-20 to 14-31 will be described.

<Configuration of AND Gates 14-20 to 14-31>

AND gate 14-20 performs an AND operation of the voltage level of node N20 and the voltage level of node N30. Next, AND gate 14-20 outputs the operation result as a signal ST0. Signal ST0 is a signal to activate (select) memory string MS0 and when signal ST0 is made high, select transistors ST1, ST2 constituting memory string MS0 are turned on. The condition for this operation is that, as described above, signal MSTRING is low. This also applies to ST1 to ST11.

AND gate 14-21 performs an AND operation of the voltage level of node N21 and the voltage level of node N30. Next, AND gate 14-21 outputs the operation result as a signal ST1.

AND gate 14-22 performs an AND operation of the voltage level of node N22 and the voltage level of node N30. Next, AND gate 14-22 outputs the operation result as a signal ST2.

AND gate 14-23 performs an AND operation of the voltage level of node N23 and the voltage level of node N30. Next, AND gate 14-23 outputs the operation result as a signal ST3.

AND gate 14-24 performs an AND operation of the voltage level of node N20 and the voltage level of node N40. Next, AND gate 14-24 outputs the operation result as a signal ST4.

AND gate 14-25 performs an AND operation of the voltage level of node N21 and the voltage level of node N40. Next, AND gate 14-25 outputs the operation result as a signal ST5.

AND gate 14-26 performs an AND operation of the voltage level of node N22 and the voltage level of node N40. Next, AND gate 14-26 outputs the operation result as a signal ST6.

AND gate 14-27 performs an AND operation of the voltage level of node N23 and the voltage level of node N40. Next, AND gate 14-27 outputs the operation result as a signal ST7.

AND gate 14-28 performs an AND operation of the voltage level of node N20 and the voltage level of node N50. Next, AND gate 14-28 outputs the operation result as a signal ST8.

AND gate 14-29 performs an AND operation of the voltage level of node N21 and the voltage level of node N50. Next, AND gate 14-29 outputs the operation result as a signal ST9.

AND gate 14-30 performs an AND operation of the voltage level of node N22 and the voltage level of node N50. Next, AND gate 14-30 outputs the operation result as a signal ST10.

AND gate 14-31 performs an AND operation of the voltage level of node N23 and the voltage level of node N50. Next, AND gate 14-31 outputs the operation result as a signal ST11.

Next, OR gate 14-32 to 14-37 will be described.

<Configuration of OR Gates 14-32 to 14-37>

OR gate 14-32 performs an OR operation of signal ST0 and signal ST1 and outputs the operation result to both of select circuits 14-40, 14-41 described later via a node N60. That is, if one of signal ST1 and signal ST2 is made high, OR gate 14-32 outputs a high to node N60. Outputting the OR operation result to both select circuits arranged next to each other also applies to OR gates 14-33 to 14-37.

OR gate 14-33 performs an OR operation of signal ST2 and signal ST3 and outputs the operation result to a node N61. That is, if one of signal ST2 and signal ST3 is made high, OR gate 14-33 outputs a high to node N61.

OR gate 14-34 performs an OR operation of signal ST4 and signal ST5 and outputs the operation result to a node N62. That is, if one of signal ST4 and signal ST5 is made high, OR gate 14-34 outputs a high to node N62.

OR gate 14-35 performs an OR operation of signal ST6 and signal ST7 and outputs the operation result to a node N63. That is, if one of signal ST6 and signal ST7 is made high, OR gate 14-35 outputs a high to node N63.

OR gate 14-36 performs an OR operation of signal ST8 and signal ST9 and outputs the operation result to a node N64. That is, if one of signal ST8 and signal ST9 is made high, OR gate 14-36 outputs a high to node N64.

OR gate 14-37 performs an OR operation of signal ST10 and signal ST11 and outputs the operation result to a node N65. That is, if one of signal ST10 and signal ST11 is made high, OR gate 14-37 outputs a high to node N65.

Next, select circuits 14-40 to 14-51 will be described

<Configuration of Select Circuits 14-40 to 14-51>

Select circuit 14-40 outputs signal ST0 or an operation result by OR gate 14-32 in accordance with the value of signal MSTRING as a signal STRADD<0>. More specifically, if signal MSTRING is low, the value of signal ST0 is output as signal STRADD<0>.

In other words, if signal MSTRING is low, as described above, a plurality of memory strings MS is not selected and memory string MS0 of memory strings MS0 to MS11 is to be selected as one memory string. When, for example, signal ST0 is made high, select transistors ST1, ST2 constituting memory string MS0 are turned on and memory string MS0 is thereby selected.

When signal MSTRING is high, in contrast, select circuit 14-40 outputs an operation result of OR gate 14-32 as signal STRADD<0>. In other words, when the voltage level of node N60 is high, memory string MS0 is put into a selected state.

In contrast, when the voltage level of node N60 is low, memory string MS0 is in a non-selected state. If, as will be described later, signal MSTRING is high, the output of select circuit 14-40 and that of select circuit 14-41 are synchronized.

Whether memory string MS0 corresponding to signal STRADD<0> is put into a selected state depends on data held by the registers 14-1 to 14-4. This also applies to signals STRADD<1> to STRADD<11> described below.

Next, the configuration of select circuit 14-41 will be described. Select circuit 14-41 also outputs signal ST1 or an operation result by OR gate 14-32 in accordance with the value of signal MSTRING as signal STRADD<1>. More specifically, if signal MSTRING is low, the value of signal ST1 is output as signal STRADD<1>. In other words, if signal MSTRING is low, a plurality of memory strings MS is not selected and instead, memory string MS1 is made to be selected.

When signal MSTRING is high, in contrast, select circuit 14-41 outputs an operation result of OR gate 14-32 in synchronization with select circuit 14-40 as signal STRADD<1>. In other words, when signal MSTRING is high and the voltage level of node N60 is high, memory string MS1 is also put into a selected state, in addition to memory string MS0. That is, the selection of both memory string MS0 and memory string MS1 is realized by combining OR gate 14-32, select circuit 14-40, and select circuit 14-41.

This also applies to select circuits 14-42 to 14-51.

In other words, for the set of select circuits 14-42, 14-43, when signal MSTRING is low, signal ST2 and signal ST3 are output as signal STRADD<2> and signal STRADD<3>, respectively.

When signal MSTRING is high, in contrast, the set of select circuits 14-42, 14-43 outputs an operation result of OR gate 14-33 as signal STRADD<2> and signal STRADD<3>, respectively. In other words, when the voltage level of node N61 is high, memory strings MS2, MS3 are put into a selected state.

For the set of select circuits 14-44, 14-45, when signal MSTRING is low, signal ST4 and signal ST5 are output as signal STRADD<4> and signal STRADD<5>, respectively.

When signal MSTRING is high, in contrast, the set of select circuits 14-44, 14-45 outputs an operation result of OR gate 14-34 as signal STRADD<4> and signal STRADD<5>, respectively. In other words, when signal MSTRING is high and the voltage level of node N62 is high, memory strings MS4, MS5 are both put into a selected state.

For the set of select circuits 14-46, 14-47, when signal MSTRING is low, signal ST6 and signal ST7 are output as signal STRADD<6> and signal STRADD<7>, respectively.

When signal MSTRING is high, in contrast, the set of select circuits 14-46, 14-47 outputs an operation result of OR gate 14-35 as signal STRADD<6> and signal STRADD<7>, respectively, and if the voltage level of node N63 is high, the corresponding memory strings MS6, MS7 are put into a selected state.

For the set of select circuits 14-48, 14-49, when signal MSTRING is low, signal ST8 and signal ST9 are output as signal STRADD<8> and signal STRADD<9>, respectively.

When signal MSTRING is high, in contrast, the set of select circuits 14-48, 14-49 outputs an operation result of OR gate 14-36 as signal STRADD<8> and signal STRADD<9>, respectively. In other words, when signal MSTRING is high and the voltage level of node N64 is high, memory strings MS8, MS9 are both put into a selected state.

Further, for the set of select circuits 14-50, 14-51, when signal MSTRING is low, signal ST10 and signal ST11 are output as signal STRADD<10> and signal STRADD<11>, respectively.

When signal MSTRING is high, in contrast, the set of select circuits 14-50, 14-51 outputs an operation result of OR gate 14-37 as signal STRADD<10> and signal STRADD<11>, respectively, and if the voltage level of node N65 is high, the corresponding memory strings MS10, MS11 are both put into a selected state.

From the foregoing, when signal MSTRING is made high, among the above signals STRADD<0> to STRADD<11>, one set from the set of signal STRADD<0> and signal STRADD<1>, the set of signal STRADD<2> and signal STRADD<3>, the set of signal STRADD<4> and signal STRADD<5>, the set of signal STRADD<6> and signal STRADD<7>, the set of signal STRADD<8> and signal STRADD<9>, and the set of signal STRADD<10> and signal STRADD<11> is put into a selected state (for example, high) and signals STRADD<0> to STRADD<11> corresponding to the selected block BLK are supplied to the row decoder 2.

When, for example, signal STRADD<0> is put into a selected state, the corresponding signals SGD<0>, SGS<0> are both made high. This also applies to signals STRADD<1> to STRADD<11>. FIG. 8 shows a conceptual diagram showing selected states of memory strings and a relationship diagram showing memory strings selected in accordance with signal STRADD.

<Relationship Diagram Between Signal STRADD and Memory Strings Selected in Accordance with Signal STRADD>

Signal STRADD and signals MS0 to MS11 are taken on the horizontal axis in FIG. 8 and the selected state (single selection, multiple selection) of memory strings MS is taken on the vertical axis. A "◯" symbol in FIG. 8 indicates that the corresponding memory string MS is selected. In contrast, no "◯", that is, a blank, indicates that the memory string MS is in a non-selected state.

As shown on the horizontal axis, when signal STRADD=003h (h indicates hexadecimal) is output from the address buffer 14 (signals STRADD<0> to STRADD<11> constitute 003h), memory strings MS0, MS1 are put into a selected state (2strings selection 1 in FIG. 8).

In other words, signal SGD<0>, signal SGS<0>, signal SGD<1>, and signal SGS<1> corresponding to memory strings MS0, MS1 are each made high.

When signal STRADD=00Ch is set, memory strings MS2, MS3 are put into a selected state (2strings selection 2) and signal SGD<2>, signal SGS<2>, signal SGD<3>, and signal SGS<3> corresponding to memory strings MS2, MS3 are each made high.

When signal STRADD=030h is set, memory strings MS4, MS5 are put into a selected state (2strings selection 3) and signal SGD<4>, signal SGS<4>, signal SGD<5>, and signal SGS<5> corresponding to memory strings MS4, MS5 are each made high.

When signal STRADD=0C0h is set, memory strings MS6, MS7 are put into a selected state (2strings selection 4) and signal SGD<6>, signal SGS<6>, signal SGD<7>, and signal SGS<7> corresponding to memory strings MS6, MS7 are each made high.

Further, when signal STRADD=300h is set, memory strings MS8, MS9 are put into a selected state (2strings selection 5) and signal SGD<8>, signal SGS<8>, signal SGD<9>, and signal SGS<9> corresponding to memory strings MS8, MS9 are each made high.

Lastly, when signal STRADD=C00h is set, memory strings MS10, MS11 are put into a selected state (2strings selection 6) and signal SGD<10>, signal SGS<10>, signal SGD<11>, and signal SGS<11> corresponding to memory strings MS10, MS11 are each made high.

When signal MSTRING supplied from the command decoder 13 is low, as described above, one of memory strings MS0 to MS11 is put into a selected state in accordance with data held by the registers 14-1 to 14-4.

In the case of "String0 selection (when memory string MS0 is selected)", for example, 001h is output from the address buffer 14 as signal STRADD. Also for memory strings MS1 to MS11, as shown in FIG. 8, one of memory strings MS is selected by the value of signal STRADD being changed.

<Details of the Register 9>

Next, a detailed configuration of the register 9 will be described by using FIG. 9. As described above, the register 9 is enabled to hold defective information (PBFAIL in FIG. 1) of the plane P and has a function to output the defective information to the memory controller. In the description that follows, the configuration corresponding to planes P0, P1 will be shown for convenience of description.

Figure 9:
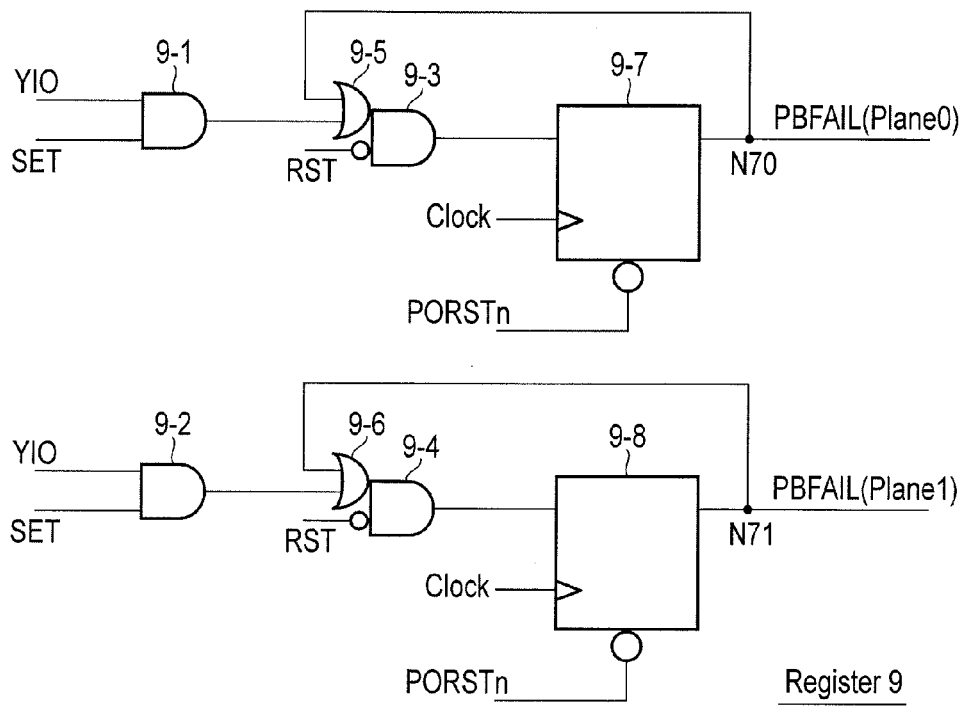
FIG. 9 is a circuit diagram showing details of a register according to the first embodiment.

In the present embodiment, as shown in FIG. 9, the register 9 is configured to be able to hold two pieces of defective information of planes P0, P1. More specifically, the register 9 includes an AND gate 9-1, an AND gate 9-2, a circuit 9-3, a circuit 9-4, an OR gate 9-5, an OR gate 9-6, a register 9-7, and a register 9-8.

<Configuration to Output Defective Information of Plane P0>

AND gate 9-1 performs an AND operation of a signal line YIO (8-bit data) and a signal SET (low or high) and supplies the operation result to one end of OR gate 9-5. Signal SET is a signal that allows the register 9 to capture data and signal line YIO is a signal line to transfer, for example, 8-bit read data supplied from the sense amplifier 3. 8-bit data transmitted through signal line YIO includes defective information of plane P0. Signal SET is a signal supplied from the state machine 8.

OR gate 9-5 performs an OR operation of an operation result from AND gate 9-1 and the voltage level of a node N70 (signal PBFAIL) and supplies the operation result to circuit 9-3.

Circuit 9-3 performs an AND operation of an operation result from OR gate 9-5 and the value obtained by inverting a signal RST and supplies the operation result to the register 9-7. Signal RST is a signal to initialize data that may be held by the register 9-7 and is a signal supplied from the state machine 8. The register 9-7 is also enabled to hold defective information of, for example, plane P0.

A signal PORSTn, a signal Clock, and an operation result from circuit 9-3 are supplied to the register 9-7. Signal PORSTn is an asynchronous reset signal to initialize defective information of the plane P held by the register 9-7 during power-on. In other words, if signal PORSTn is made low for the register 9-7 after power-on, defective information of plane P0 that has been held by the register 9-7 is reset.

Signal Clock is a signal to update data held by the register 9-7. That is, when a high signal Clock is supplied, the data held by the register 9-7 is updated (defective information of plane P0).

An operation result supplied to the register 9-7 from circuit 9-3 in the timing when signal Clock is made high is supplied to node N70 as signal PBFAIL (indicating plane P0).

Signal SET and signal RST are signals having similar functions for plane P1 and supplied from the state machine 8.

<Configuration to Output Defective Information of Plane P1>

Like AND gate 9-1, AND gate 9-2 performs an AND operation of signal line YIO and signal SET and supplies the operation result to one end of OR gate 9-6.

OR gate 9-6 performs an OR operation of an operation result from AND gate 9-2 and a node N71 (signal PBFAIL) and supplies the operation result to AND gate 9-4.

Circuit 9-4 performs an AND operation of an operation result from OR gate 9-6 and the value obtained by inverting signal RST and supplies the operation result to the register 9-8. Signal PORSTn, signal Clock, and an operation result from AND gate 9-4 are supplied to the register 9-8. Signal PORSTn and signal Clock are the same as those described regarding the register 9-7 and thus, the description thereof is omitted.

When signal PORSTn is made low for the register 9-8, defective information of plane P1 that has been held by the register 9-8 is reset.

An operation result supplied to the register 9-8 from AND gate 9-4 in the timing when signal Clock is made high is supplied to node N71 as signal PBFAIL (indicating plane P1).

However, the above is not a configuration required for the present invention and may be modified without deviating from the scope of the present invention.

<Details of the Output Buffer 16>

Figure 10:
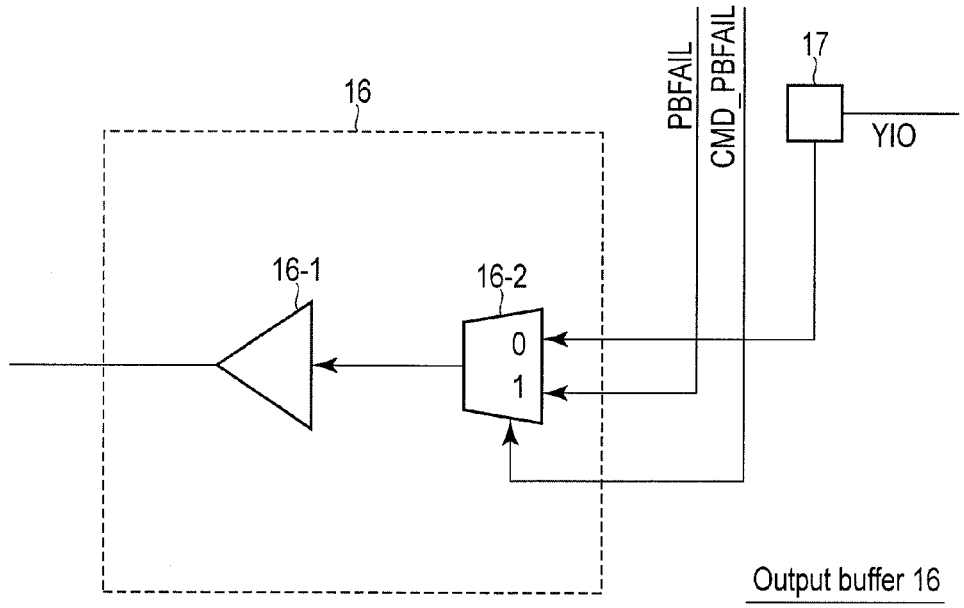
FIG. 10 is a block diagram showing details of an output buffer according to the first embodiment.

Details of the output buffer 16 are shown in FIG. 10. The output buffer 16 includes an output driver 16-1 and a select circuit 16-2.

The output of select circuit 16-2 is connected to the input terminal of the output driver 16-1 and the output terminal of the output driver 16-1 is connected to the first buffer 12 shown in FIG. 1.

Signal PBFAIL from the register 9 and read data transferred via signal line YIO are supplied to select circuit 16-2 and also a signal CMD_PBFAIL from the command decoder 13 to select/output one of signal PBFAIL and the read data is supplied.

More specifically, when signal CMD_PBFAIL is made high, signal PBFAIL supplied from the register 9 is output to the memory controller via the first buffer 12.

In contrast, when signal CMD_PBFAIL is made low, read data supplied from the distributor 17 is output to the memory controller via the first buffer 12.

<Details of Signal PBFAIL>

Details of signal PBFAIL will be described by using FIG. 11. In the present embodiment, the memory cell array 1 including planes P0 to P3 is taken as an example to describe signal PBFAIL. FIG. 11 is a conceptual diagram of signal PBFAIL held by the register 9 and shows, as described above, defective information of planes P0 to P3 output from the IO pad via the output buffer 16 and the first buffer 12.

Signal PBFAIL in the present embodiment includes, for example, a 4-bit data sequence corresponding to planes P0 to P3.

IO0 indicates defective information of plane P0 and IO1 indicates defective information of plane P1. IO2 and IO3 similarly indicate defective information of plane P2 and plane P3, respectively.

No defective information of the plane P is output from IO4 to IO7 in the present embodiment and N/A is set.

A binary 1 value of signal PBFAIL indicates the corresponding plane P is defective and is not available. In contrast, a 0 value indicates that the corresponding plane P is available. In other words, a 0 value indicates a case when the corresponding plane P has no defective bit and no defective memory string MS.

As shown in FIG. 11, PBFAIL=1111 in the upper part. In other words, all planes P0 to P3 included in the memory cell array 1 are determined to be defective and the memory cell array 1 is not available.

In the lower part, PBFAIL=0010. In other words, planes other than plane P1 are determined to be available.

<Operation of the Command Decoder 13>
<Operation 1>

Next, a part of the operation of the command decoder 13 described with reference to FIG. 6 will be described by using FIG. 12A. FIG. 12A is a timing chart showing the timing when signal MSTRING is output from the command decoder 13.

The write enable signal (WEnx), IOx<7:0>, signal WE_Clock, signal N1, and signal MSTRING are taken on the vertical axis and the time t is represented by the horizontal axis. It is assumed that a signal AA supplied from the memory controller via the IO pad is 10101010 and signal AA≠signal XX.

As shown in FIG. 12A, at time t0, signal AA transferred from the memory controller via IOx<7:0> is supplied to the first decoder 13-1 as a signal DIN. With this signal AA, as described above, signal N1 is made high.

At the same time t0, signal WEnx and signal WE_Clock are low. Incidentally, as shown in FIG. 12A, changes of the voltage level of signal WE_Clock follow those of signal WEnx. Thus, when signal WEnx goes, for example, low, signal WE_Clock also goes low accordingly.

Then, at time t1, signal WEnx changes the voltage level from low to high and following signal WEnx, the voltage level of signal WE_Clock is also switched from low to high. At this timing, a high signal MSTRING is output from the register 13-3 having received signal N1 (see an arrow in FIG. 12A).

Then, it is assumed that at time t3, signal WEnx goes low again, signal WE_Clock is also made low in synchronization therewith, and signal XX is supplied from the TO pad.

Signal XX is different from signal AA and thus, signal N1 output by the first decoder 13-1 stays low.

Then, even if signal WEnx is made high and signal WE_Clock is made high in synchronization therewith at time t4, it is desirable for the design to be such that signal MSTRING stays high.

It is also desirable for the design to be such that signal MSTRING made high at time t1 stays high thereafter until initialized by a reset command (not shown).

<Operation 2>

Next, the remaining operation of the command decoder 13 described with reference to FIG. 6 will be described by using FIG. 12B. FIG. 12B is a timing chart showing the timing when signal CMD_PBFAIL is output from the command decoder 13.

The write enable signal (WEnx), IOx<7:0>, signal WE_Clock, signal N2, and signal CMD_PBFAIL are taken on the vertical axis and the time t is represented by the horizontal axis. It is assumed that a signal AB supplied from the memory controller via the IO pad is 10101011 and signal AC≠signal AB.

As shown in FIG. 12B, at time t0, signal AB transferred from the memory controller via IOx<7:0> is supplied to the second decoder 13-2 as a signal DIN. With this signal AB, as described above, a high signal N2 is output from the second decoder 13-2.

At the same time t0, signal WEnx is made low and in synchronization with signal WEnx, signal WE_Clock is also made low. Next, at time t1, the voltage level thereof is switched from low to high. At this timing, a high signal CMD_PBFAIL is output from the register 13-4 having received signal N2 (see arrow in FIG. 12B).

Then, it is assumed that at time t3, signal WEnx goes low again, signal WE_Clock is also made low in synchronization therewith, and signal AC (for example, 10101100) is supplied from the IO pad.

Next, when signal WE_Clock is made high in synchronization with signal WEnx at time t4, the output of signal CMD_PBFAIL is made low at this timing (see arrow in FIG. 12B). In this manner, the output of other defective information (for example, page write defective information) may be made switchable.

<Open Defect Detection Operation of the Bit Line BL>

Figure 13A:
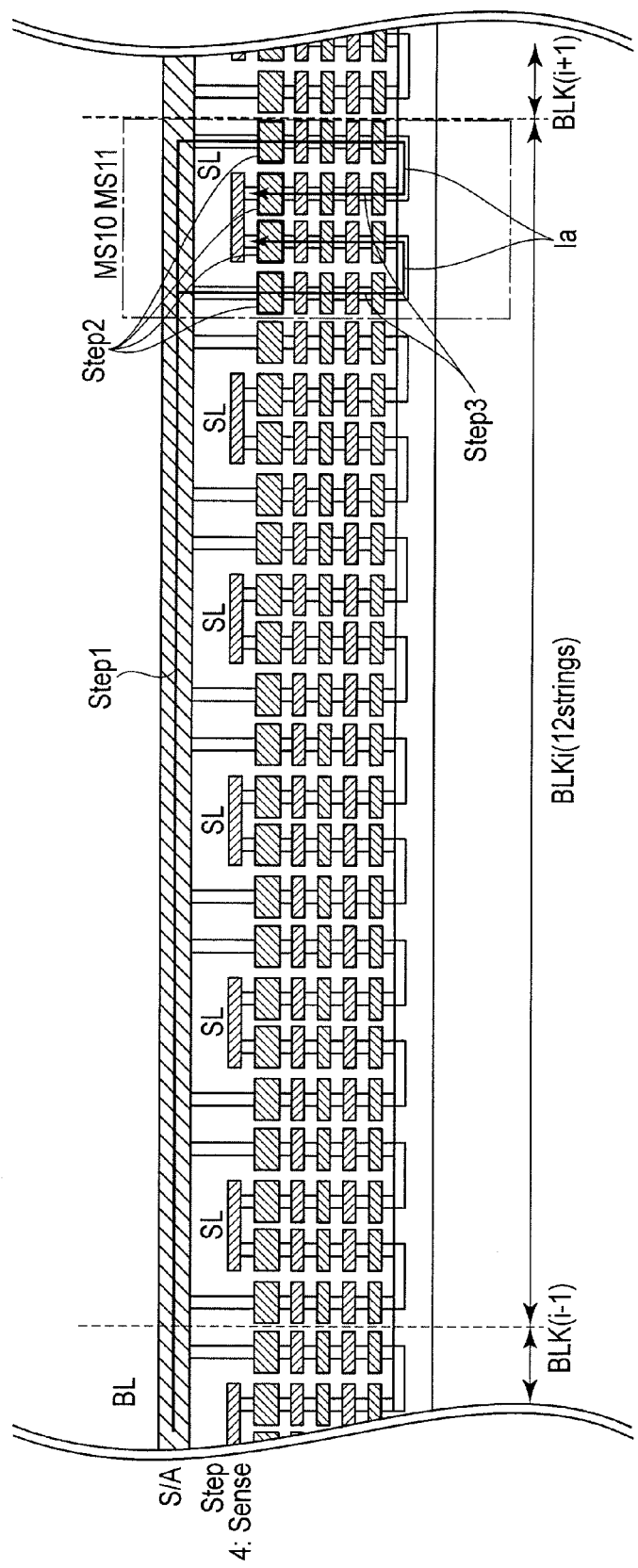
FIG. 13A is a conceptual diagram showing a defect detection operation of a bit line according to the first embodiment and a case when there is no bit line open defect.
Figure 13B:
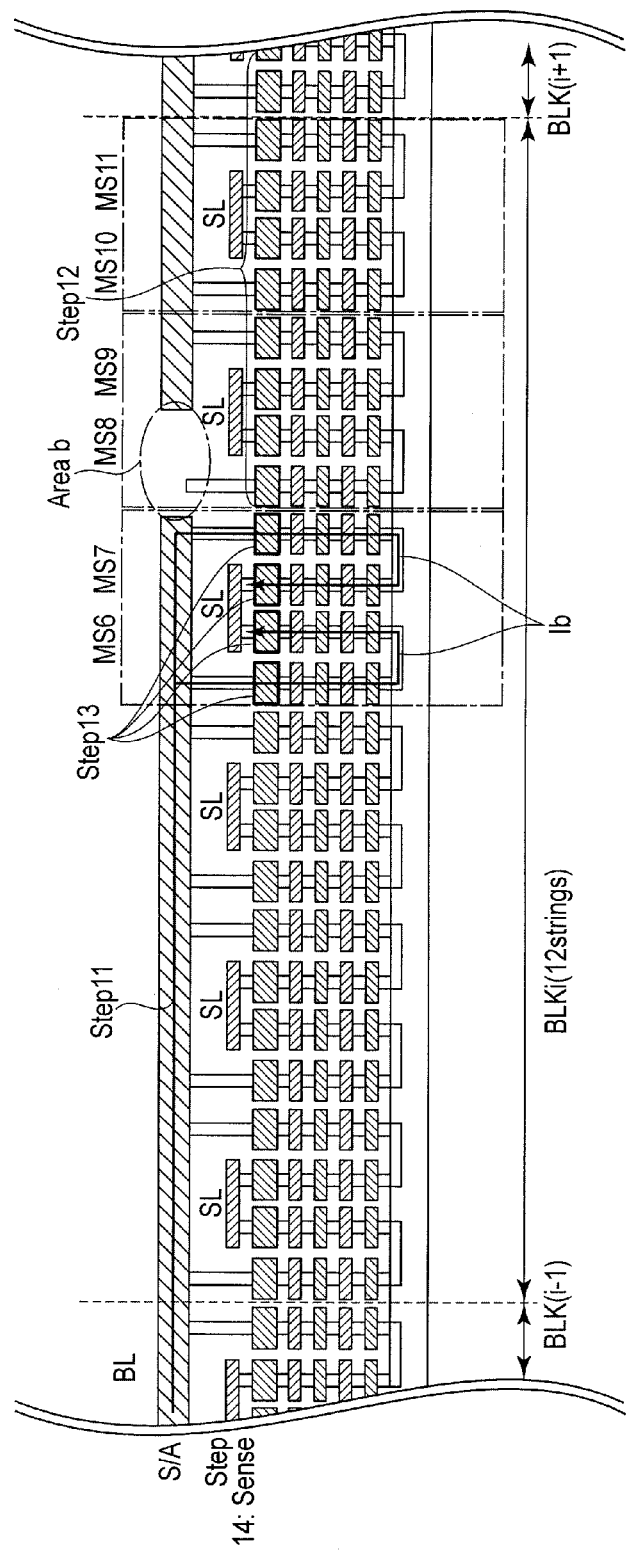
FIG. 13B is a conceptual diagram showing the defect detection operation of the bit line according to the first embodiment and a case when there arises a bit line open defect in an area b.
Figure 13C:
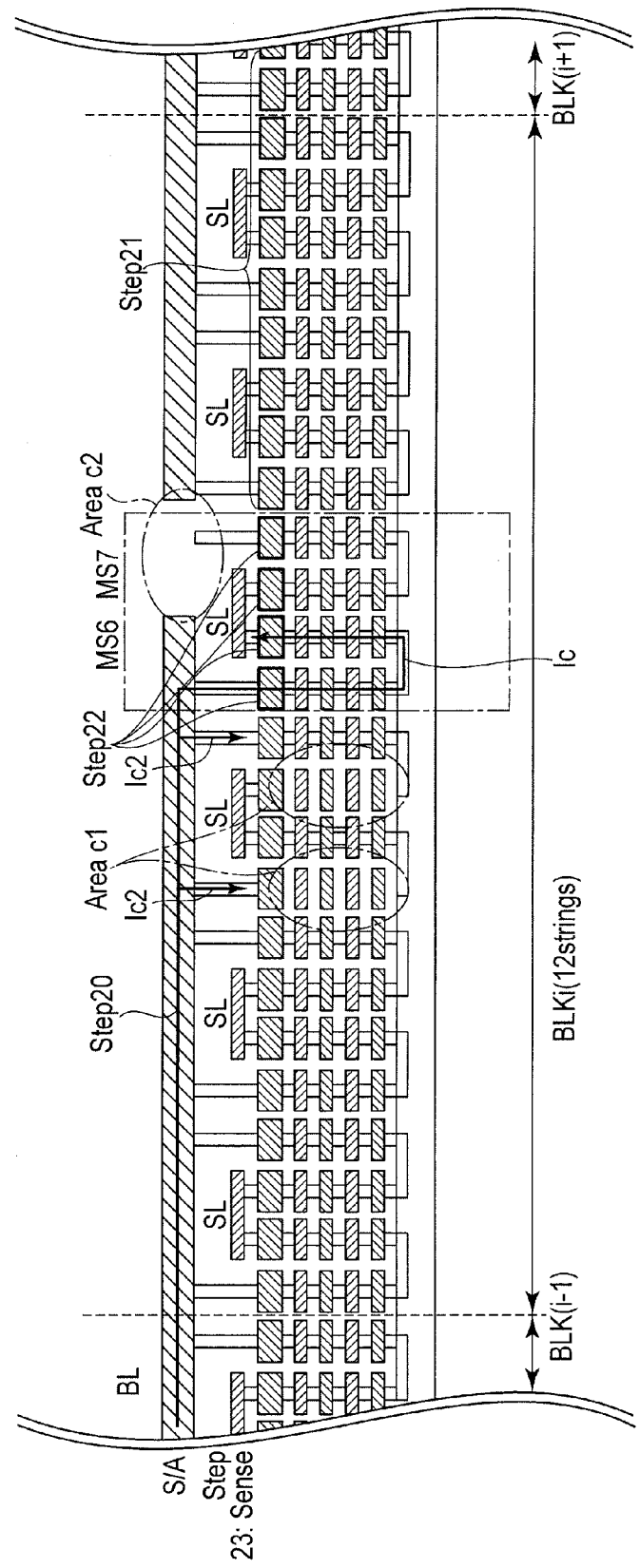
FIG. 13C is a conceptual diagram showing the defect detection operation of the bit line according to the first embodiment and a case when there arises a memory string MS defect in an area c1 and a bit line open defect in an area c2.

Next, detection operations of various (Case A to Case C below) bit line BL open defects will be described by using FIGS. 13A to 13C. FIGS. 13A to 13C are conceptual diagrams in which after the bit line BL being charged in FIG. 3, select transistors ST1, ST2 corresponding to the predetermined memory string MS are selected and the discharge of the bit line BL is detected. Accordingly, open defects of the bit line BL are detected.

<Case A>

FIG. 13A is a conceptual diagram showing a case when the bit line BL to be detected has no open defect and memory strings MS0 to MS11 connected to the bit line BL have no defect. The description will be provided by taking a case when block BLKi is focused on and memory strings MS10, MS11 are selected as an example. Block BLKi may be the farthest block BLK (i=t in this case) from the sense amplifier 3, a block in the center, or the closest block BLK (i=0 in this case) to the sense amplifier 3.

Step S1: A current is passed from the sense amplifier 3 to the bit line BL to charge the bit line BL.

Step S2: Next, select transistors ST1, ST2 of memory strings MS10, MS11 are put into a selected state, that is, turned on by signal STRADD=C00h output by the address buffer 14.

It is assumed that at this point, the read non-selection voltage VREAD is applied to the control gates CG of memory cells MC0 to MC7.

Step S3: Accordingly, memory strings MS10, MS11 are put into a conducting state. In other words, a current flows from the bit line BL to the commonly connected source line SL via memory strings MS10, MS11 (Ia in FIG. 13A), thereby starting the discharge.

Step S4: The sense amplifier 3 detects bit line BL open defects by sensing the potential of the bit line BL.

In Case A described above, the potential of the bit line BL is discharged and thus, the state machine 8 determines that there is no open defect between the sense amplifier 3 and block BLKi (the bit line BL to which memory strings MS10, MS11 are connected).

Block BLKi is focused on here, but after the detection of block BLKi, the focus may be shifted to the adjacent block BLK(i+1) to gradually move the bit line BL to be detected away from the sense amplifier 3.

Regarding the order of the memory string MS to be selected, memory strings MS10, MS11 may first be selected or memory strings MS0, MS1 close to the sense amplifier 3 may first be selected. This also applies to Case B and Case C.

<Case B>

Next, the detection operation of bit line BL open defects in Case B will be described by using FIG. 13B. FIG. 13B is a conceptual diagram showing a case when a disconnection arises in an area b in the bit line BL to be detected.

Step S11: This step is the same as step S1 and thus, the description is omitted.

Step S12: Next, the memory strings MS are selected in the order of the set of memory strings MS10, MS11, the set of memory strings MS8, MS9 and so on according to the address supplied from the address buffer 14.

However, the bit line BL is disconnected in the area b and thus, no current flows to memory strings MS8, MS9 and memory strings MS10, MS11. That is, because the voltage of the bit line BL is not discharged, the state machine 8 determines that the bit line BL in the area of memory strings MS8 to MS11 and/or the bit line near memory strings MS9, MS10 may be open defective and shifts the address of the memory string MS to be further selected to the side of the sense amplifier 3.

Step S13: Next, select transistors ST1, ST2 of memory strings MS6, MS7 are put into a selected state, that is, turned on by the address buffer 14. Also in this case, it is similarly assumed that the voltage VREAD is applied to the control gates CG of memory cells MC0 to MC7.

Step S14: Then, the sense amplifier 3 senses the potential of the bit line BL. As a result, the potential of the bit line BL has discharged (a current Ib in FIG. 13B) and the state machine 8 having detected the discharge determines that there is no defective area on the side of the sense amplifier 3 from memory strings MS6, MS7. That is, the state machine 8 determines that there is no open defect from the sense amplifier 3 up to the bit line BL to which memory strings MS6, MS7 in block BLKi are connected.

In this Case B, the state machine 8 determines that there is no open defect from the bit line BL to which memory strings MS6, MS7 in block BLKi are connected to the sense amplifier 3, but may not determine whether the memory string MS itself is defectively formed for all memory strings MS in blocks BLK0 to BLKi-1 and memory strings MS0 to MS5 in block BLKi.

Thus, open defects of the bit line BL are adequately detected by the above operation, but after step S14, for example, memory strings MS0 to MS5 in block BLKi may further be checked for defects. This case will be described in Case C below.

<Case C>

Next, the detection operation of bit line BL open defects in Case C will be described by using FIG. 13C. FIG. 13C is a conceptual diagram showing a case when defects arise in memory strings MS4, MS5 in an area c1 of the bit line BL to be detected and further a disconnection arises in an area c2. According to the detection operation in Case C, not only open defects of the bit line BL, but also defects of the memory strings MS may be detected.

Step S20: This step is the same as step S1 and thus, the description is omitted.

Step S21: This step is also the same as step S12 and thus, the description is omitted.

Step S22: Next, memory strings MS6, MS7 are put into a selected state by signal STRADD (=0C0h) output from the address buffer 14. Also in this case, it is similarly assumed that the voltage VREAD is applied to the control gates CG of memory cells MC0 to MC7.

As shown FIG. 13C, while memory string MS7 is non-conducting, memory string MS6 is in a conducting state and the potential charged in the bit line BL are discharged via memory string MS6. In other words, a current flows from the bit line BL to the commonly connected source line SL via memory string MS6 (Ic in FIG. 13C), thereby starting the discharge.

Step S23: After step S22, the sense amplifier 3 senses the potential of the bit line BL. As a result, the potential of the bit line BL has discharged and the state machine 8 determines that there is no defective area from block BLK0 on the side of the sense amplifier 3 to the bit line BL to which memory strings MS6, MS7 in block BLKi.

In Case C, memory strings MS4, MS5 have defects. In this case, the following step may follow after step S23.

Step S24: Memory strings MS4, MS5 are put into a selected state by the address buffer 14. That is, the operation in step S12 is performed. However, memory strings MS4, MS5 are defective and are not put into a conducting state (Ic2 in FIG. 13C).

Step S25: As a result, the state machine 8 determines that memory strings MS4, MS5 are defective memory strings MS.

Hereinafter, as described above, a defective area of the memory strings MS is detected by performing a defect detection operation on the memory strings MS on the side of the sense amplifier 3 from memory strings MS2, MS3 according to the address buffer 14.

In the present embodiment, one of the open defect detection operations of the bit line BL described in Case A to Case C is performed at, for example, three locations. More specifically, as an example, the defect detection operation is performed at three locations on the nearest side (block BLK0), in the center portion (block BLK(t/2)), and on the farthest side (block BLKt) when viewed from the sense amplifier 3.

<Conceptual Diagram of Defective Information of Bit Lines Held by Cache Circuits>

Figures 14, 15:
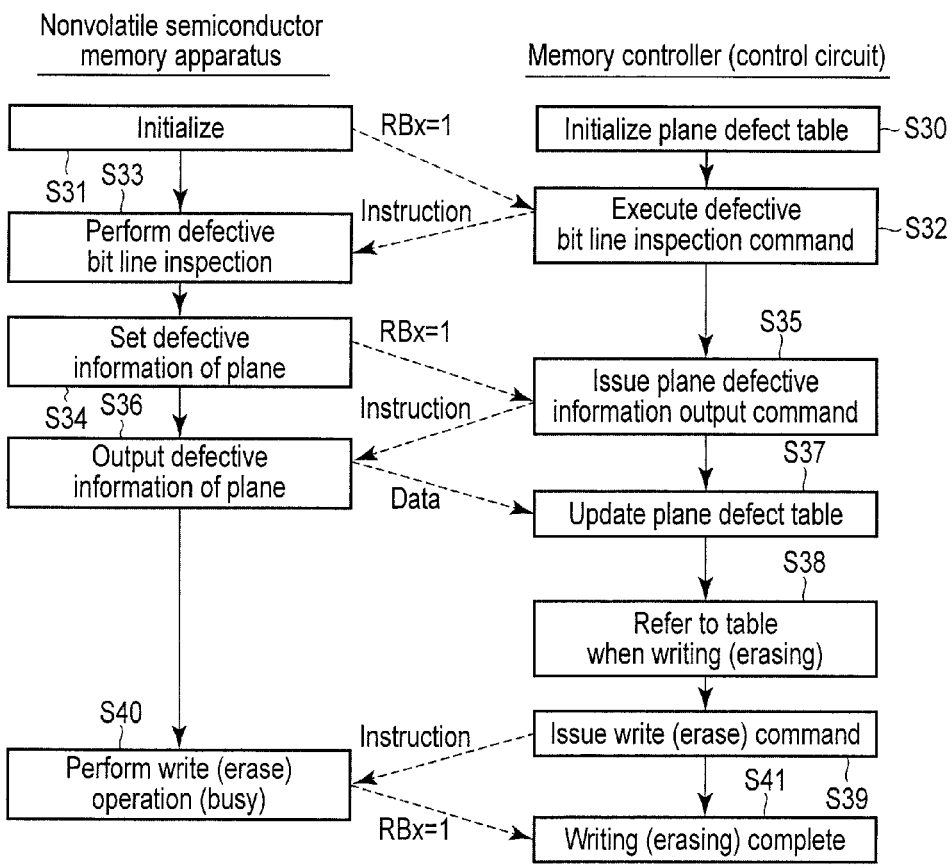
FIG. 14 is a conceptual diagram of defective information of the bit line held by a cache circuit according to the first embodiment.
FIG. 15 is a flow chart showing a write operation according to the first embodiment.

Next, FIG. 14 is used to show a conceptual diagram in which defect detection information detected by the sense amplifier 3 at three locations as an example is held by cache circuits.

FIG. 14 shows a correspondence table between cache circuits (first to third cache circuits) and bit lines BL (here, bit lines BL0 to BL7). Here, data held by the first cache circuit indicates sense results of block BLKt, data held by the second cache circuit indicates sense results of block BLKt/2, and data held by the third cache circuit indicates sense results of block BLK0.

As shown in FIG. 14, each of the first to third cache circuits holds binary 0 for bit line BL0. In this case, the state machine 8 determines that bit line BL0 has no open defect.

Also, each of the first to third cache circuits holds binary 1 for bit line BL1. That is, regarding bit line BL1, the state machine 8 determines that there is a bit line BL open defect between the sense amplifier 3 and block BLKt, in other words, in all areas related to bit line BL1.

Further, the first and second cache circuits hold binary 1 and the third cache circuit holds binary 0 for bit line BL2. That is, when viewed from the sense amplifier 3, the state machine 8 determines that there is an open defect of the bit line BL between block BLK0 and block BLKt/2. At the same time, the state machine 8 determines that there is also an available area.

Further, the first cache circuit holds binary 1 and the second and third cache circuits hold binary 0 or bit line BL3. That is, the state machine 8 determines that there is an open defect of the bit line BL between block BLKt/2 and block BLKt. At the same time, the state machine 8 determines that there is also an available area.

For bit lines BL4 to BL7, the state machine 8 determines that there is no open defect of the bit line BL, that is, all areas of blocks BLK0 to BLKt are available regarding bit lines BL4 to BL7.

<Data Write Operation and an Inspection Operation Before the Write Operation>

Next, the write operation of data and an inspection operation before the write operation will be described by using FIG. 15. However, the above write operation is only an example and may be applied also to the erase operation and read operation.

The data write operation that will be described below is a flow showing the operation of both of a memory controller (controller) and a nonvolatile semiconductor memory apparatus under the control of the memory controller.

More specifically, the flow shows a series of operations in which after a command to request output of defective information being received by the nonvolatile semiconductor memory apparatus from the memory controller, the nonvolatile semiconductor memory apparatus outputs defective information of the plane P to the memory controller and then an appropriate write operation is performed by the memory controller having received the defective information.

The memory controller in the present embodiment includes a plane P management table (not shown), but the table may also be held by the host device. The plane P management table may hold defective information of the plane P of the nonvolatile semiconductor memory apparatus. The flow will be described below.

As illustrated, in step S30, the plane P management table in the memory controller is initialized (S30).

On the other hand, when, for example, the semiconductor apparatus is connected to the host device (for example, a personal computer) and thereby turned on, the state machine 8 resets defective information in the register 9 based on detection information from the supply detector 10 (S31). In other words, the state machine 8 makes signal PORSTn low and resets defective information in the register 9.

When the operation in step S31 is completed, the nonvolatile semiconductor memory apparatus makes the ready/busy signal output to the memory controller high, that is, ready for receiving (RBx=1 in FIG. 15).

Upon receipt of the ready/busy signal, the memory controller issues a command to inspect the bit line BL for open defects to the nonvolatile semiconductor memory apparatus (S32).

Then, the nonvolatile semiconductor memory apparatus performs an operation to inspect for the defective bit line BL. That is, the nonvolatile semiconductor memory apparatus performs one of the operations performed in FIGS. 13A to 13C to obtain defect detection information through the sense amplifier 3 and then causes the first to third cache circuits to store the defect detection information (S33).

Next, if, for example, plane P3 is not available from the results stored in the first to third cache circuits, the state machine 8 sets signal shown in FIG. 11 as PBFAIL(IO3, IO2, IO1, IO0)=1000.

The defective information obtained by the state machine 8 about the plane P as a result of step S33 is stored in the register 9 (S34). Then, the nonvolatile semiconductor memory apparatus makes the ready/busy signal high again.

Next, the memory controller issues a command to request the output of defective information of the plane P from the nonvolatile semiconductor memory apparatus (S35).

The nonvolatile semiconductor memory apparatus having received the command makes signal CMD_PBFAIL high and outputs signal PBFAIL in the register 9 to the memory controller via the output buffer 16 (S36).

Then, the memory controller having received the defective information of the plane P refers to the plane P management table to update the plane P management table (S37).

After the operation of steps S30 to S37 described above, a command to request a write operation or erase operation is issued if necessary. As described above, the write operation will be described here.

When making a request to the nonvolatile semiconductor memory apparatus to write data, the memory controller refers to the plane P management table obtained in step S37 (S38). Then, the memory controller outputs the write command, address, and write data after consideration of which data should be written in a plane P based on the plane P management table (S39). In the case of signal PBFAIL(IO3, IO2, IO1, IO0)=1000, for example, the memory controller issues an instruction to write data to planes P0 to P2.

After step S39, a write operation is performed by the state machine 8 (S40) and when the write operation is completed, the memory controller is notified of the high ready/busy signal.

Based on the ready/busy signal from the nonvolatile semiconductor memory apparatus, the memory controller determines that the write operation is completed (S41).

A case in which the plane P is used or is not used when an open defect is detected in the bit line BL as a result of the above detection operation will be described below.

Whether or not to use the plane P is decided based on the inspection result of open defects of the bit line BL described in step S33 in FIG. 15, that is, data held by the cache circuits. A concrete description will be provided below.

<When the Storage Capacity of the Nonvolatile Semiconductor Memory Apparatus does not have to be Effectively Used>

In this case, whether to use the plane P is determined in accordance with data stored in the first cache circuit holding an inspection result on the nearest side (block BLK0) when viewed from the sense amplifier 3.

As cases when the storage capacity of the nonvolatile semiconductor memory apparatus does not have to be effectively used, for example, when an excessive storage capacity of the nonvolatile semiconductor memory apparatus is available or the time needed to correct errors included in a read result should not be increased, the plane P does not have to be used.

In such a case, performance of the semiconductor apparatus in general may be improved by holding back the use of the plane P with many defects according to circumstances.

Also in this case, the state machine 8 determines that the applicable plane P is not available and enters information of unavailability in the register 9 by a method described later.

<When the Storage Capacity of the Nonvolatile Semiconductor Memory Apparatus is Effectively Used>

When there is no excessive storage capacity, it is desirable to save or use a storage area that may be used as much as possible. In this case, if, for example, the section from the nearest side (block BLK0) to the center portion (block BLKt/2) when viewed from the sense amplifier 3 is determined to be available as a result of determining that a part of the plane P may be used in consideration of the error correction capacity (not shown), the plane P is used thereafter as partially available.

Also in this case, information of unavailability is entered in the register 9 by the method described later.

Next, the method of determining whether to use the plane P will be described.

<Determination of Whether to Use the Plane P>

Whether to use the plane P should be determined in view of the configuration and performance of the whole semiconductor apparatus, but a known method may be used to determine for a nonvolatile semiconductor memory apparatus.

For example, the number of defective bits (here, 1 is the number of held bits) included in one of the first to third cache circuits selected depending on the purpose is compared with a reference number (not shown) of defective bits specified by the state machine 8 and if the number of defective bits is equal to or less than the reference number, the plane P is permissible, that is, available and if defective bits is exceeding the reference number are included, the plane P is not permissible and determined to be unavailable and information of unavailability is entered in the register 9 by the method described later.

Next, the entry of availability of the plane P in the register 9 via signal line YIO based on an inspection result after an inspection operation of open defects of the bit line BL will be described below.

<Entry of Availability of the Plane P in the Register 9>

The following method is cited as an example. If the plane P is determined to be unavailable as a result of determining whether the plane P is available, a high signal YIO is output by the sense amplifier 3.

If the plane P is determined to be available, a low signal YIO is output from the sense amplifier 3. Signal YIO may transmit an 8-bit signal in the present embodiment and thus, not only information of the single plane P, but also information of a plurality of the planes P may be output at the same time. The important thing is that the register 9 may be notified of availability information of the plane P.

When, at this point, as described above, the input signal SET of the register 9 is made high by the state machine 8 (not shown) and signal RST is low, the entry of availability information of the plane P in the register 9 is completed by signal Clock being made high.

The information should be reported to the memory controller by an output method described separately or held in a management data storage area capable of holding defective information of the plane P by a known method.

<Effects According to the Present Embodiment>

A nonvolatile semiconductor memory apparatus according to the present embodiment may achieve effects of (1) and (2) below:

(1) Open defects of the bit line BL may finely be detected.

In a nonvolatile semiconductor memory apparatus according to the present embodiment, the memory cell array has a structure stacked, as described above, in the third direction. Thus, the length $l_2$ of the bit line BL when, for example, memory strings MS0 to MS11 are accommodated becomes shorter than that in other memory structures. Other memory structures include, for example, a NAND memory string.

The NAND memory string has a known structure and so a drawing thereof is omitted, but a NAND string and the bit line BL are arranged in parallel with each other in the structure.

Though dependent on the number of memory cells MC constituting the NAND string, the length of one NAND string is generally about $l_3(>l_2)$. In other words, the length of the bit line BL for one NAND string running in parallel with the NAND string is also about $l_3$.

Then, there is a relationship of about $l_3=2l_2$ to $3l_2$ between $l_3$ and $l_2$. Therefore, there is a relationship of about $l_3=12l_1$ to $30l_1$ between $l_3$ and $l_1$.

In other words, when compared with a conventional NAND memory cell array, a memory cell array of a nonvolatile semiconductor memory apparatus according to the present embodiment has a small value of the bit line length $l_1$ and thus, finer bit line BL open defect detection may be performed.

(2) The precision of detection may be improved.

A nonvolatile semiconductor memory apparatus according to the present embodiment may select two memory strings MS by the address buffer 14.

In the case of, for example, a NAND flash memory, which is a plane memory, memory strings are selected in units of blocks. That is, a memory string in block BLK0 and a memory string in block BLK1 may be selected at the same time.

However, for example, 64 memory strings are provided in one block BLK and the length of the bit line BL running in parallel will be a distance corresponding to the number of memory strings.

In other words, when a plurality of memory strings is selected in a NAND flash memory, the distance of the bit line BL between the memory string selected in block BLK0 and the memory string selected in block BLK1 will be very long. Thus, the precision of open defect detection of the bit line BL between adjacent selected blocks BLK becomes lower.

However, a nonvolatile semiconductor memory apparatus according to the present embodiment is enabled, as described above, to select a plurality of memory strings MS provided in some block BLK. In other words, as described above, the interval between memory strings MS is narrow and therefore, open defects of the bit line BL may be detected with high precision.

If the memory string MS has many defects and the detection precision is still imperfect even if two memory strings MS are selected, the detection precision may be improved by selecting four memory strings MS.

If the memory string MS is formed in good shape, the highest precision may be achieved by selecting one memory string MS.

[Second Embodiment]

Next, a nonvolatile semiconductor memory apparatus according to the second embodiment will be described by using FIGS. 16 and 17. A nonvolatile semiconductor memory apparatus according to the second embodiment is obtained by changing the number of selectable memory strings MS from 2 to 4 in FIG. 3.

A detailed configuration of an address buffer 14 according to the present embodiment will be described below. The description of the same configuration of the address buffer 14 as the address buffer 14 according to the first embodiment is omitted.

<Configuration>
<Address Buffer 14>

As shown in FIG. 16, the address buffer 14 according to the present embodiment includes, in addition to registers 14-1 to 14-4 and a decoder unit 141, OR gates 14-60 to 14-68 and select circuits 14-70 to 14-81. The registers 14-1 to 14-4 and the decoder unit 141 are the same as in the first embodiment and thus, the description thereof is omitted.

OR gates 14-60 to 14-68 will be described below.
<OR Gates 14-60 to 14-68>

OR gate 14-60 performs an OR operation of a signal ST0 and a signal ST1. OR gate 14-62 performs an OR operation of a signal ST2 and a signal ST3. Then, OR gate 14-61 further performs an OR operation of the operation result of OR gate 14-60 and the operation result of OR gate 14-62. The operation result of OR gate 14-61 is supplied to a node N70.

OR gate 14-63 performs an OR operation of a signal ST4 and a signal ST5. OR gate 14-65 performs an OR operation of a signal ST6 and a signal ST7. Then, OR gate 14-64 further performs an OR operation of the operation result of OR gate 14-63 and the operation result of OR gate 14-65. The operation result of OR gate 14-64 is supplied to a node N71.

Further, OR gate 14-66 performs an OR operation of a signal ST8 and a signal ST9. OR gate 14-68 performs an OR operation of a signal ST10 and a signal ST11. Then, OR gate 14-67 further performs an OR operation of the operation result of OR gate 14-66 and the operation result of OR gate 14-68. The operation result of OR gate 14-67 is supplied to a node N72.

Next, select circuits 14-70 to 14-81 will be described.
<Configuration of Select Circuits 14-70 to 14-81>

Select circuit 14-70 outputs signal ST0 or an operation result by OR gate 14-61 in accordance with the value of a signal MSTRING as a signal STRADD<0>. More specifically, if signal MSTRING is low, signal ST0 is output as signal STRADD<0>.

If signal MSTRING is low, as described above, a plurality of memory strings MS is not selected and memory string MS0 of memory strings MS0 to MS11 is to be selected as one memory string. In other words, if signal MSTRING is made low and signal ST0 is made high, select transistors ST1, ST2 constituting memory string MS0 are turned on and memory string MS0 is thereby selected.

When signal MSTRING is high, in contrast, select circuit 14-70 outputs an operation result of OR gate 14-61 as signal STRADD<0>. In other words, when the voltage level of node N70 is high, memory string MS0 is put into a selected state.

In contrast, when the voltage level of node N70 is low, memory string MS0 is in a non-selected state. If, as will be described later, signal MSTRING is high, the outputs (high or low voltage level) of select circuits 14-70 to 14-73 are synchronized.

As in the first embodiment, whether memory string MS0 corresponding to signal STRADD<0> is put into a selected state depends on data held by the registers 14-1 to 14-4. This also applies to signals STRADD<1> to STRADD<11> described below.

Next, the configuration of select circuit 14-71 will be described. Select circuit 14-71 also outputs signal ST1 or an operation result by OR gate 14-61 in accordance with the value of signal MSTRING as signal STRADD<1>. More specifically, if signal MSTRING is low, the value of signal ST1 is output as signal STRADD<1>. In other words, if signal MSTRING is low, a plurality of memory strings MS is not selected and instead, memory string MS1 is made to be selected.

When signal MSTRING is high, select circuit 14-71 outputs an operation result of OR gate 14-61 in synchronization with select circuit 14-70 as signal STRADD<1>. In other words, when the voltage level of node N70 is high, memory string MS1 is also put into a selected state, in addition to memory string MS0.

Next, select circuit 14-72 will be described. Select circuit 14-72 outputs signal ST2 or an operation result by OR gate 14-61 in accordance with the value of signal MSTRING as signal STRADD<2>. More specifically, if signal MSTRING is low, signal ST2 is output as signal STRADD<2>. In other words, if signal MSTRING is low, a plurality of memory strings MS is not selected and instead, memory string MS2 is made to be selected.

When signal MSTRING is high, select circuit 14-72 outputs an operation result of OR gate 14-61 in synchronization with select circuits 14-70, 14-71 as signal STRADD<2>. In other words, when the voltage level of node N70 is high, memory string MS2 is also put into a selected state, in addition to memory strings MS0, MS1.

Further, select circuit 14-73 will also be described. Select circuit 14-73 outputs signal ST3 or an operation result by OR gate 14-61 in accordance with the value of signal MSTRING as signal STRADD<3>. More specifically, if signal MSTRING is low, the value of signal ST3 is output as signal STRADD<3>. In other words, if signal MSTRING is low, a plurality of memory strings MS is not selected and instead, memory string MS3 is made to be selected.

When signal MSTRING is high, select circuit 14-73 outputs an operation result of OR gate 14-61 in synchronization with select circuits 14-70 to 14-72 as signal STRADD<3>. In other words, when the voltage level of node N70 is high, memory string MS3 is also put into a selected state, in addition to memory strings MS0 to MS2.

Select circuits 14-74 to 14-81 are also similar and will briefly be described below.

The configuration of select circuits 14-74 to 14-77 is the same as that of select circuits 14-70 to 14-73 excluding signals ST4 to ST7 input into each select circuit and an operation result of OR gate 14-64. In other words, select circuits 14-74 to 14-77 output signals ST4 to ST7 or the value of node N71 as a signal in accordance with the value of signal MSTRING.

That is, as with select circuits 14-70 to 14-73, when signal MSTRING is made high, memory stings MS4 to MS7 are made to be selected at the same time according to the values of signals STRADD<4> to STRADD<7>.

The configuration of select circuits 14-78 to 14-81 is the same excluding the input signals and thus, the description thereof is omitted.

<Relationship Diagram Between Signal STRADD and Memory Strings Selected in Accordance with Signal STRADD>

Signal STRADD and signals MS0 to MS11 are taken on the horizontal axis in FIG. 17 and the selected state of memory strings MS is taken on the vertical axis. A "○" symbol in FIG. 17 indicates that the corresponding memory string MS is selected. In contrast, no "○", that is, a blank, indicates that the memory string MS is in a non-selected state.

As in FIG. 8, the selected memory strings MS are switched in units of four in accordance with Selection 1 to Selection 3 on the vertical axis. In other words, if the value of signal STRADD is 00Fh, signal lines SGD<0> to SGD<3> and signal lines SGS<0> to SGS<3> are each made high. That is, memory strings MS0 to MS3 are selected at the same time.

Similarly, if the value of signal STRADD is 0F0h, signal lines SGD<4> to SGD<7> and signal lines SGS<4> to SGS<7> are each made high. In other words, if memory strings MS4 to MS7 are selected at the same time and the value of signal STRADD is F00h, signal lines SGD<8> to SGD<11> and signal lines SGS<8> to SGS<11> are each made high. That is, memory strings MS8 to MS11 are selected at the same time.

When memory strings MS0 to MS11 are selected, signal STRADD=FFFh is set.

<Effects According to the Second Embodiment>

A nonvolatile semiconductor memory apparatus according to the second embodiment may also achieve effects of (1) and (2) below: That is, the detection precision of open defects of the bit line BL may be improved and also the detection precision may be improved.

In other words, even if the number of memory strings MS selected at the same time increases as in a nonvolatile semiconductor memory apparatus according to the present embodiment, the length of the bit line BL to be detected is short when compared with a NAND memory cell array. Moreover, a plurality of memory strings MS may be selected at the same time and thus, even if, for example, other three memory strings MS are defective, the detection precision may be improved by using remaining memory strings MS.

While an example in which the sense amplifier 3 includes three cache circuits is shown, but the number of cache circuits may be increased in accordance with the number of areas of the bit line BL to be detected. In other words, when open defects of the bit line BL in all blocks BLK of block BLK0 to block BLKt should be detected, for example, the number of cache circuits may be increased accordingly.

In a nonvolatile semiconductor memory apparatus according to the present embodiment, the mode is specified that the semiconductor apparatus is controlled by an external host device, but is not limited to the above example. As an example, for example, the memory controller inside the semiconductor apparatus may function as a host device. In this case, the host device directly controls the nonvolatile semiconductor memory apparatus.

Additional Remark 1

In a nonvolatile semiconductor memory apparatus according to the present embodiment, a memory cell array (1) includes a plurality of array units (planes P0 to P4) and alternate area (planes P'0 to P'4) functioning as redundant areas of the array units and if a controller (state machine 8) determines that, as a result of detection, a defect arising in an array unit maynot be saved by the alternate areas, the controller sets information indicating that the array unit maynot be used to a register (9).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Structure of the memory cell array 10 is not limited as above description. A memory cell array formation may be disclosed in U.S. patent application Ser. No. 12/532,030. U.S. patent application Ser. No. 12/532,030, the entire contents of which are incorporated by reference herein.

What is claimed is:

1. A nonvolatile semiconductor memory apparatus comprising:
   a memory cell array including a block, the block including a plurality of memory strings, the memory strings being coupled to a plurality of bit lines, the plurality of bit lines including a first bit line which is coupled to n memory strings in the block, and each memory string including a plurality of memory cells stacked and a first select transistor;
   a row decoder capable of selecting k memory strings in the block (where k is equal to or greater than 2, and k is less than n), the k memory strings being coupled to the first bit line, and the k memory strings being disposed next to each other; and
   a controller configured to detect a defect based on data read from the memory cells provided in a selected memory string.

2. The apparatus according to claim 1, further comprising:
   a register;
   wherein:
   the memory cell array includes at least one plane,
   the plane includes a plurality of blocks, and
   the register is capable of holding information indicating whether the plane is available.

3. The apparatus according to claim 1, further comprising:
   an address buffer controlling the row decoder so that the memory strings are selected,
   wherein when the address buffer receives a first signal, the address buffer controls the row decoder so that the memory strings are selected.

4. The apparatus according to claim 3, wherein:
   the address buffer includes an arithmetic circuit, a first select circuit, and a second select circuit,
   an output node of the arithmetic circuit, and one of a first input of the arithmetic circuit and a second input of the arithmetic circuit, are connected to the first select circuit and the second select circuit, and
   when the arithmetic circuit supplies the first signal to the first and second select circuits, the first and second select circuits transfer an output result of the arithmetic circuit to the row decoder.

5. The apparatus according to claim 2, further comprising:
   an input/output unit configured to exchange the data and the information to/from outside of the apparatus,
   wherein when a control signal that instructs output of the information is input into the register, the register outputs the information to the input/output unit.

6. The apparatus according to claim 2, wherein:
the row decoder selects one of the blocks when detecting the defect, and
if the bit line does not have the defect up to a position where the selected block is arranged, the controller selects the block which is different from the selected block so as to make a distance of the bit line to be detected longer.

7. The apparatus according to claim 2, wherein:
the row decoder selects one of the blocks when detecting the defect, and
if the controller determines that the bit line has the defect in the selected block, the controller selects the block which is different from the selected block so as to make a distance of the bit line to be detected shorter.

8. The apparatus according to claim 2, wherein the controller switches the selected memory strings when needed so as to set a distance of the bit line to be detected of the selected blocks.

9. A control method of a nonvolatile semiconductor memory apparatus, the method comprising:
charging a bit line to supply a current to a plurality of memory cell arrays, each of the plurality of memory cell arrays including a block, the block including a plurality of memory strings, the memory strings being coupled to a plurality of bit lines, and the plurality of bit lines including a first bit line which is coupled to n memory strings in the block;
selecting at least one of the memory cell arrays from among the plurality of memory cell arrays based on a signal held by an address buffer;
selecting k memory strings in the block (where k is equal to or greater than 2, and k is lower than n), the k memory strings being coupled to the first bit line, and the k memory strings being disposed next to each other; and
detecting a defect by a controller based on data read from the memory cells provided in the selected memory string.

10. The method according to claim 9, further comprising:
controlling, by the controller, a register to hold information indicating whether a plane including a plurality of blocks is available based on a result of the detecting.

11. The method according to claim 9, wherein when the address buffer receives a first signal, the address buffer controls the row decoder so that the memory strings are selected.

12. The method according to claim 11, wherein:
the address buffer includes an arithmetic circuit, a first select circuit, and a second select circuit,
an output node of the arithmetic circuit, and one of a first input of the arithmetic circuit and a second input of the arithmetic circuit, are connected to the first select circuit and the second select circuit, and
when the arithmetic circuit supplies the first signal to the first and second select circuits, the first and second select circuits transfer an output result of the arithmetic circuit to the row decoder.

13. The method according to claim 10, further comprising:
exchanging the data and the information to/from outside of the apparatus by an input/output unit,
wherein when a control signal which instructs output of the information is input into the register, the register outputs the information to the input/output unit.

14. The method according to claim 10, wherein:
the row decoder selects one of the blocks when detecting the defect, and
if the bit line does not have the defect up to a position where the selected block is arranged, the controller selects the block which is different from the selected block so as to make a distance of the bit line to be detected longer.

15. The method according to claim 10, wherein:
the row decoder selects one of the blocks when detecting the defect, and
if the controller determines that the bit line has the defect in the selected block, the row decoder selects the block that is different from the selected block so as to make a distance of the bit line to be detected shorter.

16. The method according to claim 10, wherein the controller switches the selected memory strings when needed so as to set a distance of the bit line to be detected of the selected blocks.

* * * * *